US009007767B2

(12) United States Patent
Nakajima

(10) Patent No.: US 9,007,767 B2
(45) Date of Patent: Apr. 14, 2015

(54) POWER INVERTER

(75) Inventor: Kenichiro Nakajima, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 380 days.

(21) Appl. No.: 13/638,400

(22) PCT Filed: Mar. 30, 2011

(86) PCT No.: PCT/JP2011/058095
§ 371 (c)(1),
(2), (4) Date: Sep. 28, 2012

(87) PCT Pub. No.: WO2011/125779
PCT Pub. Date: Oct. 13, 2011

(65) Prior Publication Data
US 2013/0021749 A1    Jan. 24, 2013

(30) Foreign Application Priority Data

Apr. 1, 2010 (JP) .................................. 2010-084777

(51) Int. Cl.
*H05K 7/20* (2006.01)
*F28F 7/00* (2006.01)
*H02M 7/00* (2006.01)

(52) U.S. Cl.
CPC ............ *H02M 7/003* (2013.01); *H05K 7/20927* (2013.01)

(58) Field of Classification Search
CPC ............ H05K 7/20927; H05K 7/1432; H05K 7/20218; H05K 7/20854; H05K 7/20872; H02M 7/537; H01L 2224/951
See application file for complete search history.

(56) References Cited

U.S. PATENT DOCUMENTS

| | | | |
|---|---|---|---|
| 5,872,711 A | 2/1999 | Janko | |
| 7,177,153 B2 * | 2/2007 | Radosevich et al. | 361/699 |
| 7,957,169 B2 * | 6/2011 | Nakajima et al. | 363/141 |
| 7,978,471 B2 * | 7/2011 | Tokuyama et al. | 361/699 |
| 2007/0096278 A1 * | 5/2007 | Nakatsu et al. | 257/678 |

(Continued)

FOREIGN PATENT DOCUMENTS

| | | |
|---|---|---|
| EP | 1 881 590 A2 | 1/2008 |
| EP | 1 919 069 A2 | 5/2008 |

(Continued)

OTHER PUBLICATIONS

International Search Report dated Jun. 28, 2011 with English translation (four (4) pages).
Extended European Search Report dated Sep. 26, 2013 (eleven (11) pages).

*Primary Examiner* — Gregory Thompson
(74) *Attorney, Agent, or Firm* — Crowell & Moring LLP

(57) ABSTRACT

A power inverter includes a metallic chassis having a containing space at an inner portion thereof, having a lid on one side in a vertical direction, the other side thereof being enclosed by a bottom, a cooling block of forming a coolant path along a bottom side in the vertical direction of the chassis, and a side portion of the inner portion of the chassis, plural semiconductor modules each incorporating a semiconductor chip for configuring an inverter circuit of converting a direct current power into an alternate current power, and provided with a direct current terminal for making a current flow to the semiconductor chip and a control terminal for controlling an operation of the semiconductor chip to be protruded to an outer portion.

19 Claims, 22 Drawing Sheets

(56) References Cited

U.S. PATENT DOCUMENTS

| | | | |
|---|---|---|---|
| 2008/0130223 A1* | 6/2008 | Nakamura et al. | 361/689 |
| 2008/0186751 A1* | 8/2008 | Tokuyama et al. | 363/131 |
| 2008/0251909 A1 | 10/2008 | Tokuyama et al. | |
| 2009/0040724 A1* | 2/2009 | Nishikimi et al. | 361/699 |
| 2009/0231811 A1 | 9/2009 | Tokuyama et al. | |
| 2011/0249421 A1* | 10/2011 | Matsuo et al. | 361/821 |

FOREIGN PATENT DOCUMENTS

| | | |
|---|---|---|
| EP | 2 101 402 A2 | 9/2009 |
| EP | 2 149 973 A2 | 2/2010 |
| JP | 2001-308266 A | 11/2001 |
| JP | 2008-259267 A | 10/2008 |
| JP | 2009-81993 A | 4/2009 |
| JP | 2009-93852 A | 4/2009 |
| JP | 2009-219270 A | 9/2009 |

* cited by examiner

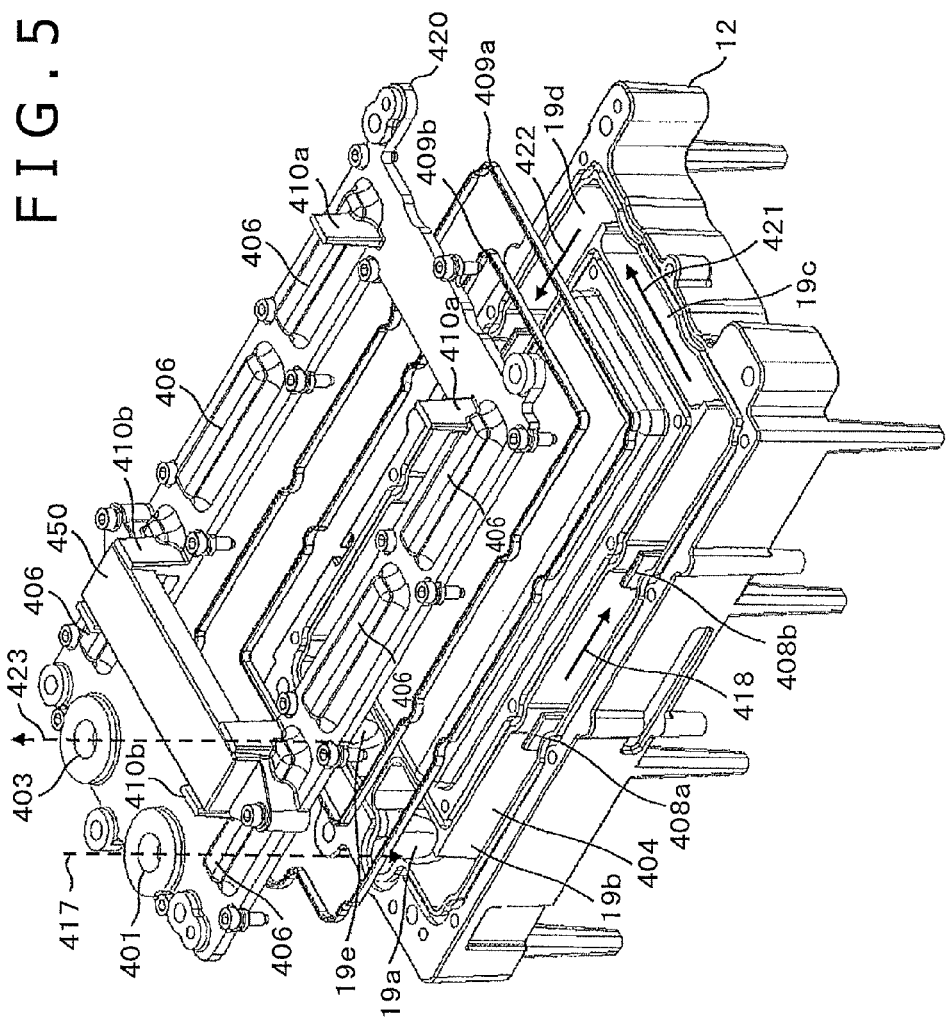

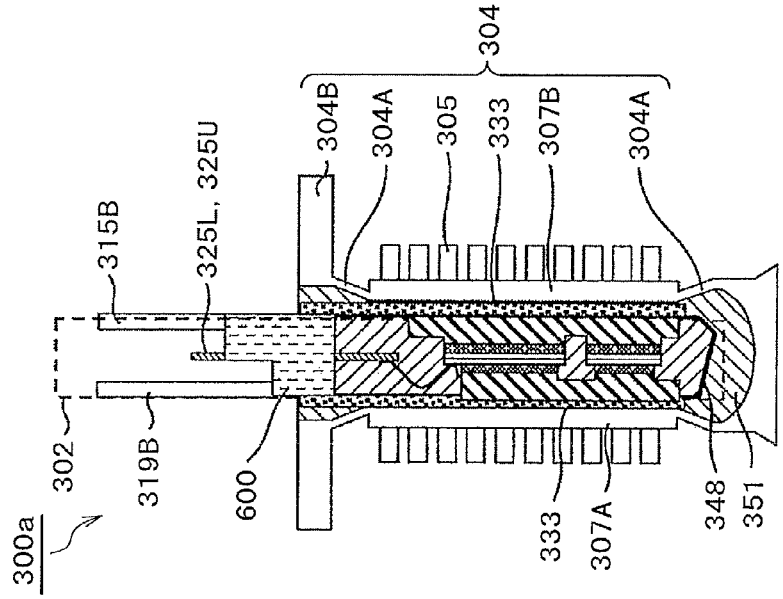
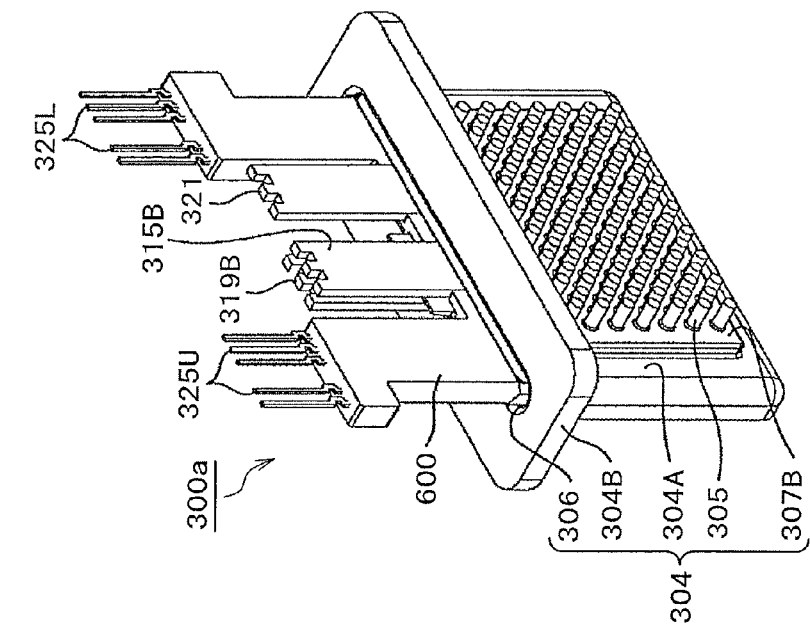
FIG.6A
FIG.6B

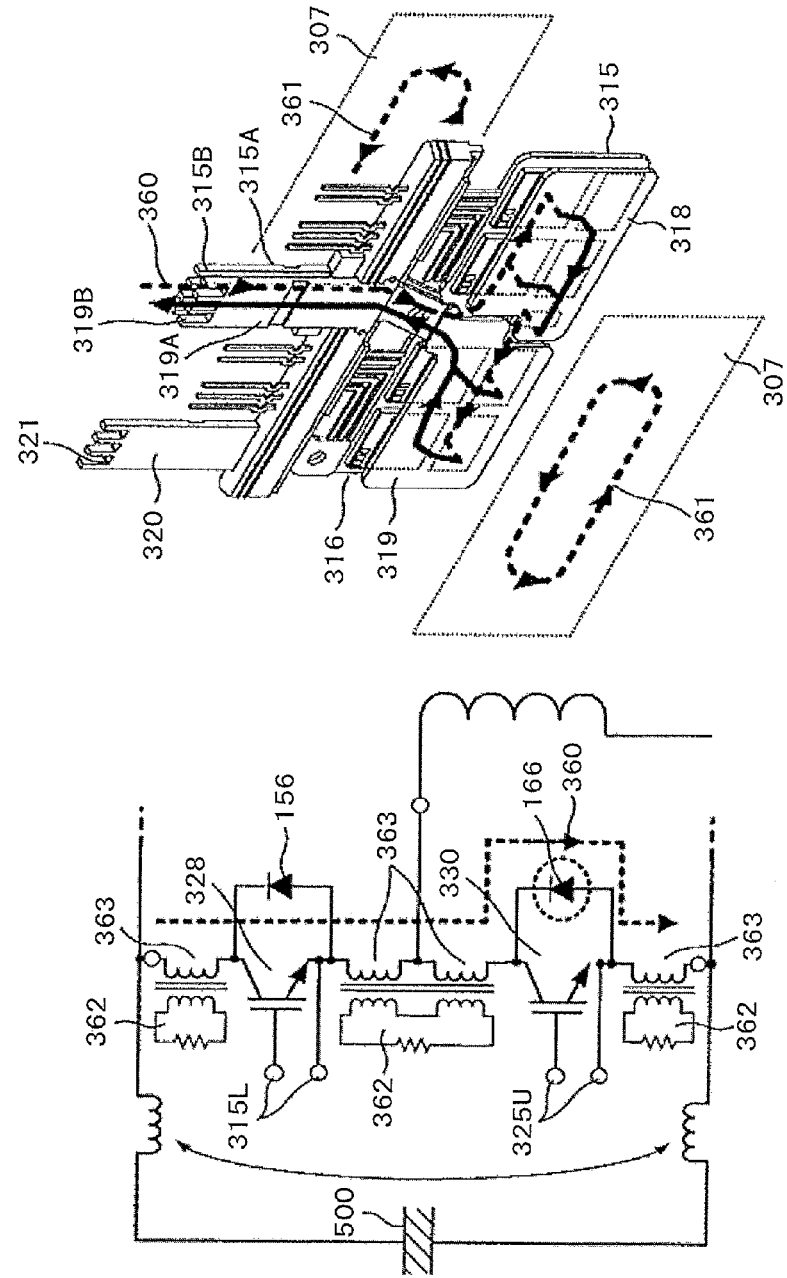

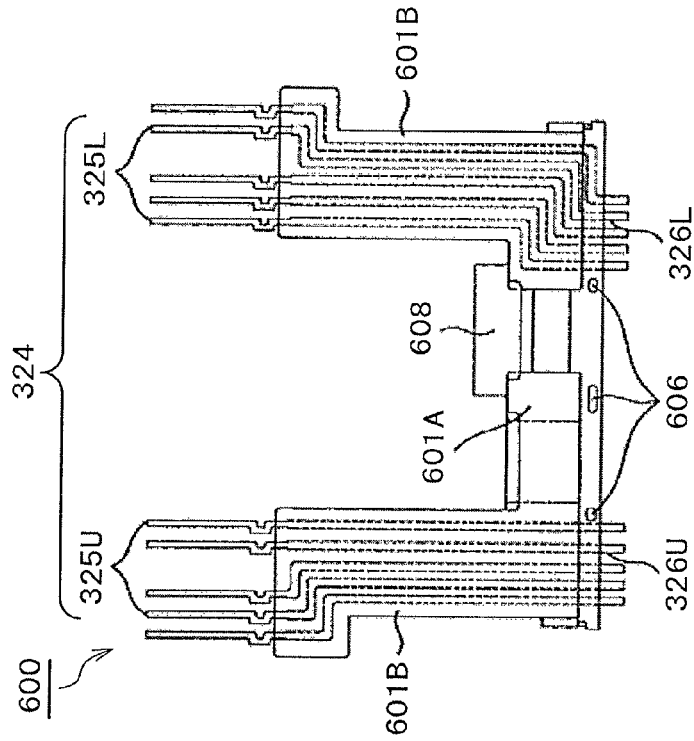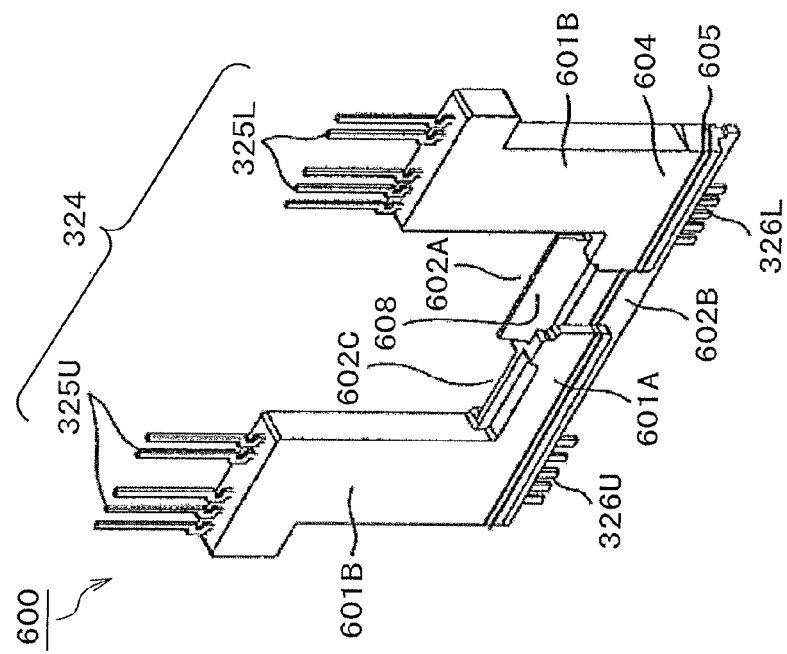

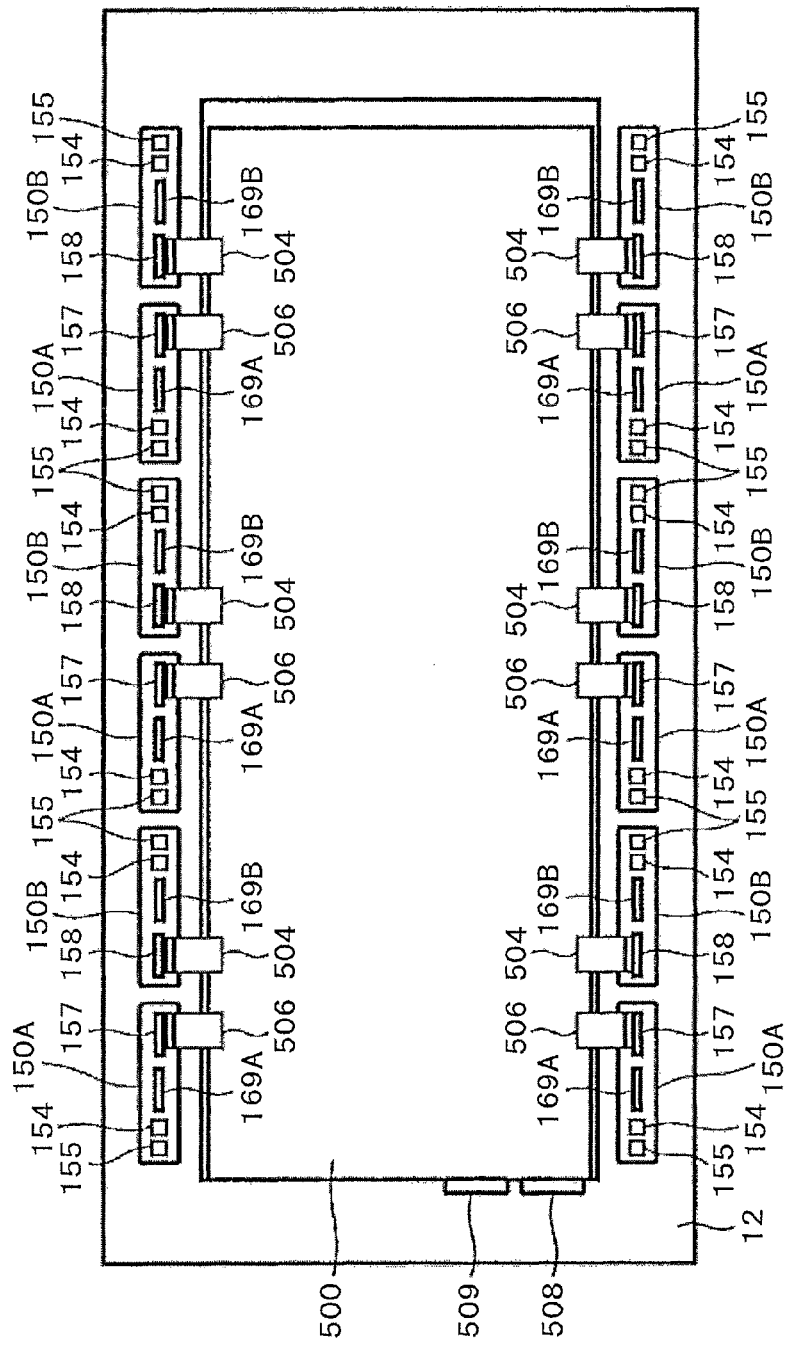

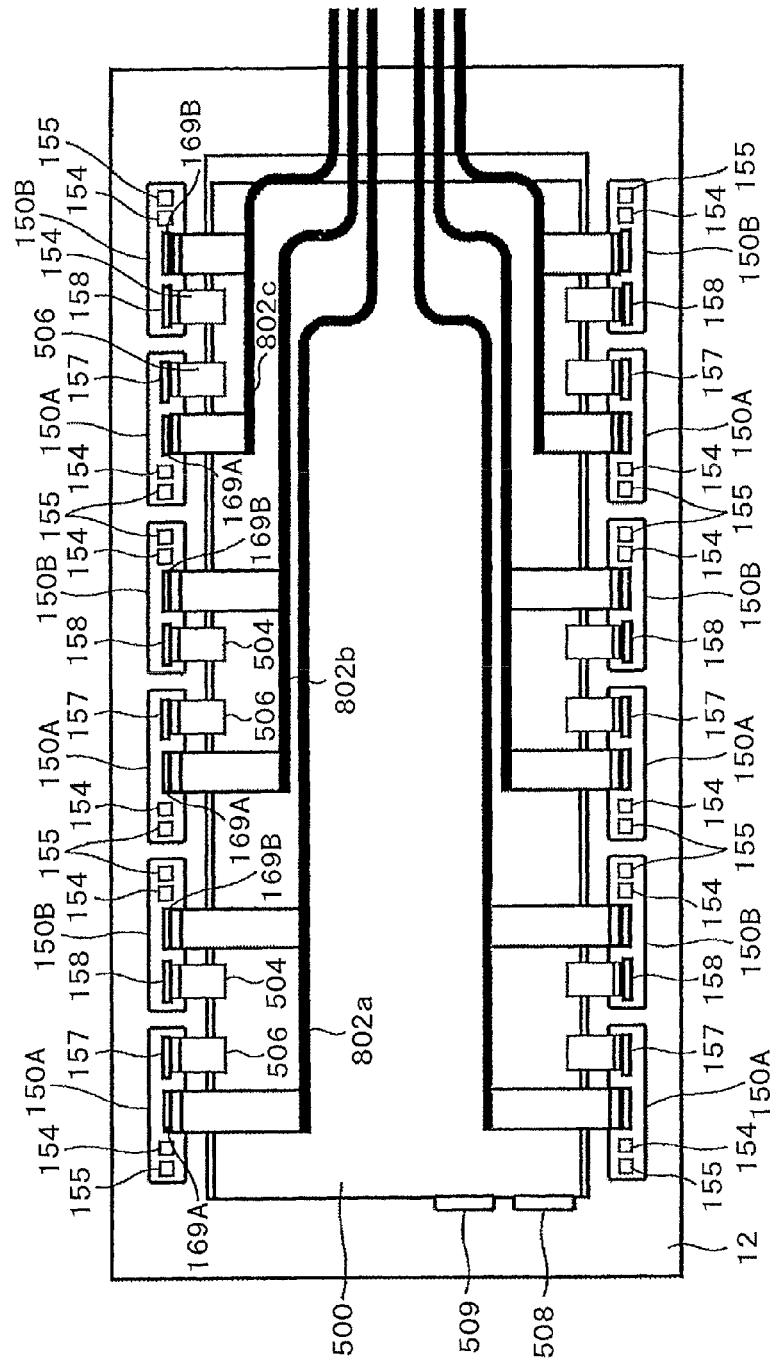

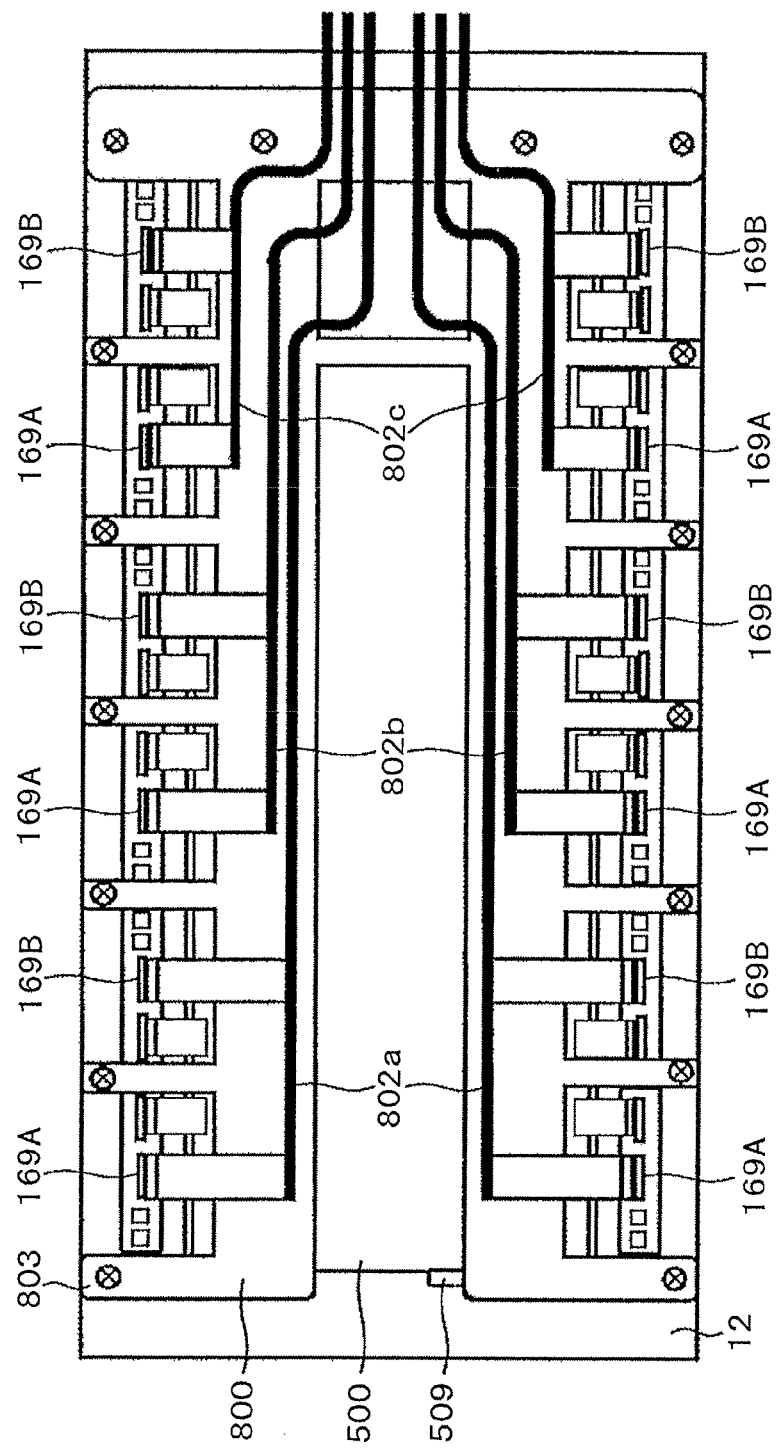

POWER INVERTER

TECHNICAL FIELD

The present invention relates to a power inverter which is used for converting a direct current power into an alternate current power or converting an alternate current power into a direct current power.

BACKGROUND ART

Generally, a power inverter includes a capacitor module for smoothing which receives a direct current power from a direct current power source, an inverter circuit of generating an alternate current power by receiving the direct current power from the capacitor module, and a control circuit for controlling the inverter circuit. The alternate current power is supplied to, for example, a motor, and the motor generates a rotating torque in accordance with the supplied alternate current power. The motor generally has a function as a generator, and when a mechanical energy is supplied from outside to the motor, the motor generates an alternate current power based on the supplied mechanical energy. There is frequently a case where the power inverter also has a function of converting an alternate current power into a direct current power, and an alternate current power generated by the motor is converted into a direct current power. A conversion from the direct current power into the alternate current power or a conversion from the alternate current power into the direct current power is controlled by the control device described above. For example, in a case where the motor is a synchronous electrical motor, a control with regard to the power conversion described above can be carried out by controlling a phase of a rotating magnetic field which is generated by a stator relative to a position of a magnetic pole of a rotor of the synchronous electrical motor. An example of the power inverter is disclosed in Japanese Unexamined Patent Publication No. 2009-219270.

A power inverter is mounted on, for example, a vehicle, receives a direct current power from a secondary battery which is similarly mounted on the vehicle, and generates an alternate current power for supplying to a motor which generates a rotational torque for driving. Also, in a regenerative braking operation, the motor generates an alternate current power based on a driving energy for generating a braking force, and the generated alternate current power is converted into a direct current power by a power inverter, charged in the secondary battery described above, and used again as a power for driving the vehicle or the like.

CITATION LIST

Patent Literature

Patent Literature 1: Japanese Unexamined Patent Publication No. 2009-219270

SUMMARY OF INVENTION

Technical Problem

The importance of a power inverter which converts a direct current power into an alternate current power for driving a motor has been more and more increased from a view point of an environmental measure or the like. With regard to the power inverter, there is a great need of further downsizing the power inverter. That is, it is desired to further increase a ratio of a converted power as compared with a volume of the power inverter.

It is an object of the present invention to provide a power inverter which can further be downsized.

Solution to Problem

According to a first mode of the present invention, there is provided a power inverter including a metallic chassis having a containing space at an inner portion thereof, having a lid on one side in a vertical direction, other side thereof being enclosed by a bottom, a cooling block forming a coolant path on a side of the bottom in the vertical direction of the chassis along a side portion of the inner portion of the chassis, plural power semiconductor modules each incorporating a semiconductor chip for configuring an inverter circuit of converting a direct current power into an alternate current power, a direct current terminal for making a current flow to the semiconductor chip and a control terminal for controlling an operation of the semiconductor chip being provided to be protruded to an outer portion, a capacitor module arranged on a center side relative to a coolant path formed along the side portion of the chassis and including a direct current terminal, an alternate current busbar assembly arranged on a side of the lid in the vertical direction of the chassis relative to the capacitor module and the coolant path, and a driver circuit arranged on the lid side in the vertical direction relative to the alternate current busbar assembly, in which the respective power semiconductor modules are fixed to the cooling block in a state of being inserted into the coolant path, and the alternate current busbar assembly includes plural alternate current bus bars for making alternate currents generated by the respective power semiconductor modules flow and plural fixing portions for fixing the alternate current busbar assembly, the plural alternate current bus bars configure a shape of extending along the coolant path, and the alternate current busbar assembly is fixed by the plural fixing portions.

According to a second mode of the present invention, in the power inverter of the first mode, it is preferable that the capacitor module configures a shape of substantially a rectangular shape, the coolant path is formed along a long side of a rectangular shape, and the plural fixing portions of the alternate current busbar assembly are arranged along the coolant path.

According to a third mod of the present invention, in the power inverter of the first mode, it is preferable that the coolant path is formed along an outer periphery of the capacitor module, and the driver circuit is formed at a driver board, the driver board includes plural driver fixing portions for fixing, and the driver fixing portion is arranged along the coolant path.

According to a fourth mode of the present invention, there is provided a power inverter including a metallic chassis having a containing space at an inner portion thereof, having a lid on one side in a vertical direction, and having a bottom on other side thereof, a cooling block of forming a coolant path on a side of the bottom in the vertical direction of the chassis, plural power semiconductor modules each incorporating a semiconductor chip for configuring an inverter circuit of converting a direct current power into an alternate current power, a direct current terminal for making a current flow to the semiconductor chip, an alternate current terminal for making an alternate current flow and a control terminal for controlling an operation of the semiconductor chip being provided to be protruded to an outer portion, a capacitor module arranged along with the coolant path and including a direct current terminal, an alternate current busbar assembly arranged on a side of the lid in the vertical direction of the chassis relative to the capacitor module and the coolant path, and a driver circuit of supplying a control signal of the semiconductor chip to the control terminal of the power semiconductor module, in which the direct current terminal of the capacitor module and the direct current terminal of each of the power semiconductor modules are electrically connected, the alternate current busbar assembly includes plural alternate current bus bars comprising wide width conductors extended along the coolant path and plural fixing portions for fixing the alternate current busbar assembly, a narrow face of each of the wide width conductors of each of the alternate current bus bars comprising the wide width conductor is directed in the vertical direction, the wide width face is directed in a direction of traversing the vertical direction and the wide width faces of the respective alternate current bus bars are arranged to be opposed to each other via a space, and the respective alternate current bus bars of the alternate current busbar assembly are connected to the corresponding alternate current terminals of the power semiconductor module.

According to a fifth mode of the present invention, in the power inverter of the fourth mode, it is preferable that a board having the driver circuit is arranged on the lid side of the alternate current busbar assembly, and the alternate current terminal of the power semiconductor module and the corresponding alternate current busbar assembly are connected by welding, and the board having the driver circuit and the control terminal of the power semiconductor module are connected by soldering.

According to a sixth mode of the present invention, there is provided a power inverter including a metallic chassis having a containing space at an inner portion thereof, and having a lid on one side in a vertical direction and a bottom on other side thereof, a cooling block forming a first and a second coolant path on a side of the bottom in the chassis respectively along both side portions of the inner portion of the chassis, a power semiconductor module incorporating a semiconductor chip for configuring an inverter circuit of converting a direct current power into an alternate current power, a direct current terminal for making a current flow in the semiconductor chip, an alternate current terminal for making an alternate current flow, and a control terminal for controlling an operation of the semiconductor chip being provided to be protruded to an outer portion, a capacitor module arranged by being interposed by the first and the second coolant path and including a direct current terminal, an alternate current busbar assembly arranged on the lid side in the chassis relative to the capacitor module and the coolant path, and a driver circuit of supplying a control signal to the control terminal of the power semiconductor module, in which the plural power semiconductor modules are arranged to be respectively inserted into the first and the second coolant paths, the direct current terminal of the capacitor module and the corresponding direct current terminal of the power semiconductor module are electrically connected, the alternate current busbar assembly includes sets of a first and a second alternate current bus bar respectively arranged along the first and the second coolant paths and having respective plural alternate current bus bars of a wide width shape, and plural fixing portions for fixing the alternate current busbar assembly, the sets of the respective alternate current bus bars are fixed by directing respective narrow faces of the alternate current bus bars of the wide width shape in the vertical direction and directing wide width faces thereof in a direction of traversing the vertical direction, the set of the first alternate current bus bars is arranged along the first coolant path, and the set of the second alternate current bus bars is arranged along the second coolant path, and an electrical circuit is arranged between the sets of the first and the second alternate current bus bars.

According to a seventh mode of the present invention, in the power inverter of the sixth mode, it is preferable that the electrical circuit arranged between the sets of the first and the second alternate current bus bars is an inverter circuit for accessories for generating an alternate current power of driving a motor for accessories.

According to an eighth mode of the present invention, there is provided a power inverter including a metallic chassis having a containing space at an inner portion thereof, a capacitor module for smoothing arranged at the inner portion of the chassis and including a direct current terminal, a cooling block of forming a coolant path along the capacitor module, a power semiconductor module incorporating a series circuit of upper and lower arms for configuring an inverter circuit of converting a direct current power into an alternate current power, a direct current terminal for making a current flow to the series circuit of the upper and lower arms, an alternate current terminal for outputting an alternate current power, and a control terminal for controlling an operation of the upper and lower arms being provided to be protruded to an outer portion, an alternate current busbar assembly arranged on one side in a vertical direction of the chassis relative to the capacitor module and the coolant path, and a driver circuit further arranged on the one side in the vertical direction relative to the alternate current busbar assembly, in which the plural power semiconductor modules are arranged to be inserted into the coolant path, the direct current terminal of the capacitor module is electrically connected to the direct current terminal of the power semiconductor module so as to supply a direct current power, the alternate current busbar assembly includes plural alternate current bus bars having a wide width extended along the coolant path and a fixing portion for fixing the alternate current busbar assembly, the power semiconductor module includes cooling surfaces on both faces thereof, includes a semiconductor module case configured by a shape slender in the vertical direction and slender along the flow path, and the direct current terminal and the alternate current terminal protruded from the semiconductor module case to the one side in the vertical direction, and is provided with the control terminal further protruded to be long to the one side in the vertical direction relative to the direct current terminal and the alternate current terminal, the alternate current busbar assembly is electrically connected to the corresponding alternate current terminal of the power semiconductor module, and the driver circuit supplies a control signal for controlling the upper arm or the lower arm to the corresponding control terminal of the power semiconductor module.

According to a ninth mode of the present invention, in the power inverter of the eighth mode, it is preferable that the alternate current bus bars having the wide width of the alternate current busbar assembly are configured by a shape of directing respective narrow faces thereof in the vertical direction and respectively extending the alternate current bus bars along the coolant path, and wide width faces of the alternate current bus bars configuring the alternating busbar assembly being arranged to be opposed to each other via a space.

According to a tenth mode of the present invention, in the upper converter device of the eighth mode or the ninth mode, it is preferable that the alternate current output terminals are provided respectively in an extending direction along the coolant path.

According to an eleventh mode of the present invention, there is provided a power inverter including a metallic chassis having a containing space at an inner portion thereof, a capacitor module for smoothing including a direct current terminal and provided at an inner portion of the chassis, a cooling block forming a coolant path to be along the capacitor module at the inner portion of the chassis, a power semiconductor module incorporating a semiconductor chip for configuring an inverter circuit of converting a direct current power into an alternate current power, the semiconductor chip being provided with a direct current terminal for making a current flow to the semiconductor chip, an alternate current terminal for making an alternate current flow, and a control terminal for controlling an operation of the semiconductor chip being provided to be protruded to an outer portion, an alternate current busbar assembly arranged on one side in a vertical direction of the chassis relative to the capacitor module and the coolant path, and a driver circuit arranged on the one side in the vertical direction relative to the alternate current busbar assembly, in which the direct current terminal of the capacitor module and the direct current terminals of the respective power semiconductor modules are connected by welding, and the alternate current busbar assembly includes plural alternate current bus bars extended along the coolant path and a fixing portion for fixing the alternate current busbar assembly, the alternate current busbar assembly being fixed to the cooling block by the fixing portion.

According to a twelfth mode of the present invention, in the power inverter of the eleventh mode, it is preferable that the alternate current terminals of the respective power semiconductor modules are connected to the corresponding alternate current terminal of the power semiconductor module by welding.

According to a thirteenth mode of the present invention, there is provided a power inverter including a metallic chassis having a containing space at an inner portion thereof, having a lid on one side in a vertical direction, other side thereof being enclosed by a bottom, a cooling block forming a coolant path along a side portion of the inner portion of the chassis, a power semiconductor module incorporating a semiconductor chip for configuring an inverter circuit of converting a direct current power into an alternate current power, a direct current terminal for making a current flow to the semiconductor chip, an alternate current terminal for making an alternate current flow, and a control terminal for controlling an operation of the semiconductor chip being provided to be protruded to an outer portion, a capacitor module arranged to a center side relative to the coolant path, fixed to the cooling block, and including a direct current terminal, an alternate current busbar assembly arranged on the one side in the vertical direction of the chassis relative to the capacitor module and the coolant path, and a driver circuit in which the plural power semiconductor modules are fixed by being inserted into the coolant path, the alternate current busbar assembly includes plural alternate current bus bars having a wide width, and a fixing portion for fixing the alternate current busbar assembly, the alternate current bus bars are arranged such that respective narrow width faces thereof are directed in the vertical direction, and the respective wide width faces are opposed to each other via a space, the alternate current busbar assembly is fixed to the cooling block, and the driver circuit is fixed to the cooling block.

According to a fourteenth mode of the present invention, there is provided a power inverter including a metallic chassis a containing space at an inner portion thereof, having a lid on one side in a vertical direction, other side thereof being enclosed by a bottom, a cooling block arranged at the inner portion of the chassis, and forming a coolant path along a side portion of the chassis, plural power semiconductor modules each incorporating a semiconductor chip for configuring an inverter circuit of converting a direct current power into an alternate current power, a direct current terminal for making a current flow to the semiconductor chip, an alternate current terminal for making an alternate current flow, and a control terminal for controlling an operation of the semiconductor chip being provided to be protruded to an outer portion and fixed by being inserted into the coolant path, a capacitor module for smoothing arranged at a center side relative to the coolant path, fixed to the cooling block, and including a direct current terminal, an alternate current busbar assembly arranged on the one side in the vertical direction of the chassis relative to the capacitor module and the coolant path, and a driver circuit of supplying a control signal to the control terminal of the power semiconductor module, in which the direct current terminal of the capacitor module is protruded from the capacitor module to be extended to a side of the corresponding direct current terminal of the power semiconductor module, an end portion thereof configures a shape of being extended to the one side in the vertical direction along a main current terminal of the power semiconductor module, and an end portion of the direct current terminal of the capacitor module is connected to the direct current terminal of the power semiconductor module by welding, an alternate current bus bar configuring a wide width shape included in the alternate current busbar assembly is extended to a side of the alternate current terminal of the power semiconductor module, an end portion thereof configures a shape of being extended to the one side in the vertical direction along the alternate current terminal, and the end portion is connected to the alternate current terminal by welding, and the driver circuit is connected to the control terminal of the power semiconductor module by soldering.

According to a fifteenth mode of the present invention, in the power inverter of the fourteenth mode, it is preferable that a direct current bus bar protruded from the capacitor module and connected to the corresponding direct current terminal of the power semiconductor module has a first portion of extending from the capacitor module to a side of the main current terminal of the power semiconductor module, and a second portion of extending an end portion thereof to the one side in the vertical direction along the direct current terminal, and connected to the direct current terminal of the power semiconductor module by welding at the second portion, and an alternate current bus bar of a wide width conductor included in the alternate current busbar assembly has a first portion of extending to a side of the alternate current terminal of the power semiconductor module, and a second portion of extending an end portion thereof to be folded to bend to the one side in the vertical direction along the alternate current terminal, and is connected to the alternate current terminal of the power semiconductor module by welding at the second portion.

According to a sixteenth mode of the present invention, there is provided a power inverter including a metallic chassis having a containing space at an inner portion thereof, having a lid on one side in a vertical direction, other side thereof being enclosed by a bottom, and having a fixing portion for fixing to the transmission for a vehicle at an outer portion on the other side, and a cooling block arranged at the inner portion of the metallic chassis, and forming a coolant path for making a coolant flow, a power semiconductor module incorporating a semiconductor chip of configuring an inverter circuit for converting a direct current power into an alternate current power, a capacitor module including a direct current terminal, an alternate current busbar assembly for making an alternate current generated by the power semiconductor module flow, and a current sensor, in which the capacitor module and the coolant path are arranged to align so as to arrange the coolant path along the capacitor module, the alternate current busbar assembly is arranged on the one side in the vertical direction relative to the capacitor module, the alternate current busbar assembly includes plural alternate current bus bars for making an alternate current flow, and a holder of holding the plural alternate current bus bars and a fixing portion for fixing, and the alternate current busbar assembly is fixed to the cooling block by the fixing portion of the holder, and the current sensor for measuring a current flowing in the alternate current bus bar is fixed to the alternate current busbar assembly.

According to a seventeenth mode of the present invention, there is provided a power inverter arranged with a metallic chassis having a containing space at an inner portion thereof, having a lid on one side in a vertical direction, other side thereof being enclosed by a bottom, and having a fixing portion for fixing to the transmission at other portion of the other side, and a cooling block of forming coolant paths for respectively making a coolant flow to both side portions of the inner portion of the metallic chassis, a power semiconductor module of converting a direct current power into an alternate current power, and the capacitor module for smoothing, the power inverter being arranged with an alternate current busbar assembly for making an alternate current flow to the one side in the vertical direction relative to the capacitor module, the power inverter being arranged with a current sensor for measuring a current flowing in the alternate current bus bar on the one side in the vertical direction relative to the capacitor module, and within a range interposed by the coolant paths arranged on the both side relative to an axial direction of making the coolant flow.

According to an eighteenth mode of the present invention, in the power inverter of the seventeenth mode, it is preferable that the alternate current busbar assembly is arranged on the one side in the vertical direction relative to the power semiconductor module and the capacitor module, the alternate current busbar assembly is further fixed to the cooling block, and the cooling block is contained in the chassis.

The power inverter according to the embodiment of the present invention includes the cooling block of forming the coolant path for making the coolant flow, the plural power semiconductor modules incorporating at least one of the semiconductor chips for configuring the inverter circuit of converting the direct current power into the alternate current power, and the capacitor module for smoothing in the chassis of the power inverter. The power conductor module includes the direct current terminal for making the current flow to the semiconductor chip, the control terminal for controlling the operation of the chip, and the alternate current terminal of outputting the alternate current power. In the vertical direction of the chassis, the alternate current busbar assembly is arranged on the one side by interposing the space relative to the coolant path and the capacitor module, and the driver circuit is arranged further on one side of the alternate current assembly.

Advantageous Effects of Invention

According to the present invention, a ratio of a converted power as compared with a volume of a power inverter can further be increased.

BRIEF DESCRIPTION OF DRAWINGS

FIG. 5 is a view viewing a cooling block shown in FIG. 4 from a bottom side for explaining the cooling block.

FIG. 6(a) is a perspective view showing an outlook of a power semiconductor module. FIG. 6(b) is a sectional view of the power semiconductor module.

FIG. 9(a) is a circuit diagram for explaining an effect of reducing an inductance. FIG. 9(b) is an explanatory view for explaining an operation of reducing the inductance.

FIG. 10(a) is a perspective view of a connecting part structure. FIG. 10(b) is a perspective view of the connecting part structure.

FIG. 20 is an upper view in which the cooling block is integrated with a power semiconductor module and a capacitor module of other configuration.

FIG. 21 is an upper view showing a state of connecting the power semiconductor module shown in FIG. 20 and an alternating bus bar.

FIG. 22 is an upper view of a state of attaching a busbar assembly to the cooling block shown in FIG. 20.

DESCRIPTION OF EMBODIMENTS

Figure 1:
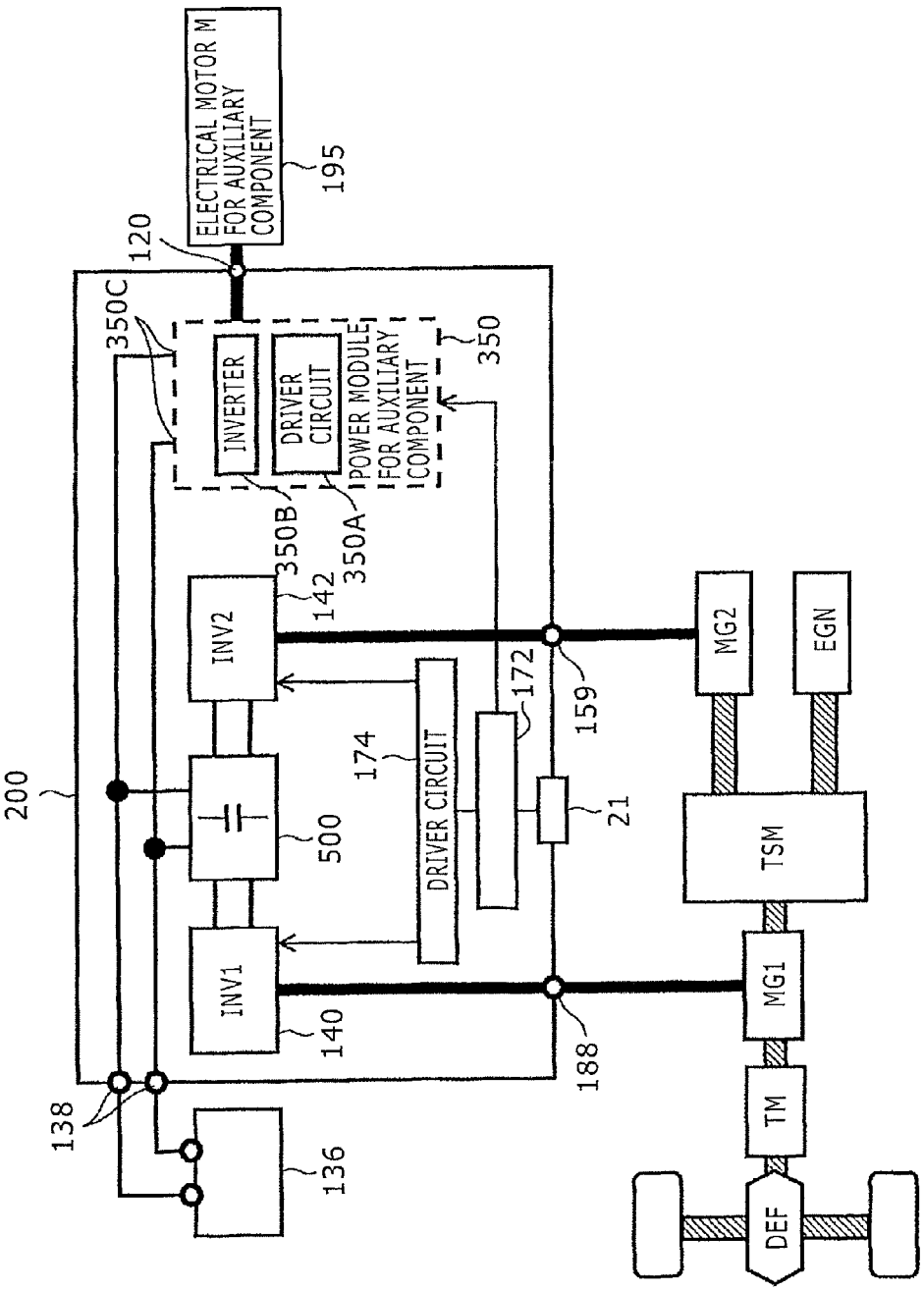
FIG. 1 is a system diagram showing a system of a hybrid electric vehicle to which a power inverter according to an embodiment of the present invention is applied.

A power inverter described in embodiments to which the present invention is applied and which is explained below and a system which uses the device resolve various problems which are preferable for resolving for reducing to a product. As one of the various problems resolved by the embodiments, there is a problem of downsizing described in the section of Technical Problem which is intended to resolve by the present invention described above, and there is an effect of downsizing described in the section of Advantageous Effects of Invention described above. That is, the power inverter and the system using the power inverter, described below in details, resolve various problems which are preferable to resolve for reducing to a product. There is the problem of downsizing described in the section of Technical Problem described above. Not only the effect of downsizing described in the section of Advantageous Effects of Invention described above but various effects can be achieved by resolving various problems other than the problem or effect described above. Also with regard to the problem of downsizing described in the section of Technical Problem described above and a configuration of achieving the effect of downsizing described in the section of Advantageous Effects of Invention described above, the problem described above can be resolved and the effect described above can be achieved not only by the configuration described in the section of Solution to Problem described above but other configuration and the effect described above can be achieved. That is, the present invention amounts to resolving the problem and achieving the effect grossly with regard to downsizing by a configuration other than the configuration described above with regard to the problem and the effect of downsizing. In viewing further specifically, the problem is resolved in different viewpoints, and the effect is achieved. A number of representative ones will be enumerated as follows. The other ones will be described in Description of Embodiments.

Configuration 1 for resolving the problem preferable for further downsizing will be described below. Configuration 1 is a configuration of arranging a coolant path and a capacitor module for smoothing in a chassis, further arranging a power semiconductor module having a prolonged longitudinal shape along the coolant path, arranging a direct current bus bar for making a direct current flow from the capacitor module to the power semiconductor module, arranging an alternate current bus bar on an upper side in a vertical direction of the direct current bus bar, and arranging a control signal line for controlling the power semiconductor module above the alternate current bus bar in a chassis. A total configuration of the power inverter can be arranged in a further regular state and downsizing of the power inverter can be carried out by the configuration. Also, the configuration can achieve an effect of capable of further downsizing a size in a transverse direction of traversing the coolant path, that is, a transverse direction of the power inverter. According to the effect described above, a considerable effect is achieved particularly in a case of using a power semiconductor module incorporating a series circuit of upper and lower arms of an inverter, and the effect can be achieved even in a case of using a power semiconductor module inserted with either one arm of the upper and the lower arms. However, in a case of using the power semiconductor module inserted with a single arm, the power semiconductor modules for the upper arm and the lower arm of the inverter are separately used, and therefore, bus bar configurations for connecting the arms is increased.

In configuration 1 described above, furthermore, a direct current bus bar and an alternate current bus bar are arranged on a further side portion in the chassis of the power conductor device, the capacitor module can be arranged along therewith on a center side of the bus bars, and an upper portion of the capacitor module can effectively be used. For example, other circuit can be arranged at an upper portion of the capacitor module, for example, as in embodiments, a semiconductor module for accessories for generating an alternate current power of driving a motor for accessories of a compressor or the like can be arranged at the portion as in embodiments. Thereby, downsizing of the power inverter can be realized. In addition thereto, a distance of connecting the capacitor module and the power semiconductor module is shortened, and an effect is achieved in low inductance formation. In a case of connecting electrically by welding, a space of using welding apparatus is easy to be ensured, and the productivity is improved.

Further in configuration 1 described above, the power semiconductor module and the capacitor module can combinedly be cooled by the coolant path by providing a cooling block for forming a coolant path along an outer shape of the capacitor module, and configuring to fix the capacitor module to the cooling block. A direct current bus bar and an alternate current bus bar can be arranged to be adjacent to a side portion, and therefore, the other circuit arranged on the upper side of the capacitor module can be arranged to be adjacent to the cooling block. In addition to the power semiconductor module and the capacitor module, the other circuit can efficiently be cooled. The other circuit may be various parts for configuring a circuit. Particularly as described above, a total of the device can further be downsized by arranging the semiconductor module for accessories to the portion as other circuit, and the semiconductor module for accessories can efficiently be cooled, which amounts to also an improvement in reliability.

Configuration 2 which is other configuration for resolving the problem preferable for further downsizing will be described below. Configuration 2 is that plural alternate current bus bars for outputting an alternate current power from the power semiconductor module, or supplying an alternate current power generated by a motor to a power semiconductor module are configured by conductors having wide widths, faces having narrow widths of the respective alternate current bus bars are arranged to be along a vertical direction of the chassis, and faces having wide widths are arranged to align to be opposed to each other. An effect of capable of downsizing a volume occupied by the plural alternate current bus bars is achieved by the configuration.

In addition to configuration 2 described above, there is constructed a configuration of integrating the plural alternate current bus bars as an alternate current busbar assembly. The alternate current busbar assembly includes a holder having a fixing portion, and the configuration of integrating the plural alternate current bus bars is constructed by fixing the plural alternate current bus bars to the holder. The total can further be downsized by the configuration. The plural alternate current bus bars can be fixed by fixing the fixing portion of the alternate current busbar assembly, and the productivity is improved. Also, a possibility of interfering with other circuit or an inner face of the chassis can be reduced, which amounts to an improvement in reliability.

In addition to configuration 2 described above, the achievement of downsizing the power inverter is further facilitated when the flow path for making the coolant flow is arranged along the side portion of the chassis, and the alternate current bus bar is arranged along the flow path of the coolant. The power semiconductor module is arranged along the flow path of the coolant, and therefore, electric connection is also facilitated.

Configuration 3 which is other configuration for resolving the problem preferable for further downsizing will be described as follows. Configuration 3 is that plural alternate current bus bars for outputting an alternate current power from the power semiconductor module, or for receiving an alternate current power generated by a motor by the power semiconductor module are configured by wide width conductors, the respective alternate current bus bars are arranged along coolant flows respectively arranged on the both side portions of the chassis, and other circuit is arranged at a center position relative to the alternate current bus bars on the both side portions. As other circuit, for example, as in the embodiments, the semiconductor module for accessories for generating the alternate current power of driving the motor for accessories of a compressor or the like can be arranged. Thereby, downsizing the power inverter can be realized. In addition to the effect, other circuit of the semiconductor module for accessories or the like can be fixed directly or adjacently to the flow path configuring the coolant path, and other circuit of the semiconductor module for accessories can efficiently be cooled in addition to the power semiconductor module.

Configuration 4 which is other configuration for resolving the problem preferable for further downsizing will be described below. According to configuration 4, a position of connecting a signal terminal arranged along the flow path of the coolant and protruded from the power semiconductor module is provided at a position further on one side in the vertical direction of the direct current terminal or the alternate current terminal, and the driver circuit is arranged at a position on further on one side in the vertical direction relative to the capacitor module or the alternate current bus bar. A position of arranging the direct current or alternate current bus bar in which a large current flows and a position of a wiring of supplying a signal to the signal terminal can be divided in the vertical direction by constructing such a configuration, and wirings can be arranged in order. The fact amounts to realize downsizing of the power inverter. In a case where direct current or alternate current bus bars in which a large current flows are connected by a welding connection step, and connection of the signal terminals is carried out by soldering connection step, the welding step and the solder step can be divided, which amounts to an improvement in the productivity.

Configuration 5 which is other configuration for resolving the problem preferable for further downsizing will be described below. Configuration 5 is that the power inverter is configured by a structure of substantially a rectangular prism, and configured by a structure in which a coolant path of making the coolant flow is arranged along the long side of the rectangular shape of the upper face, the power semiconductor module is arranged along the flow path of the coolant, the alternate current bus bar is configured by a wide width conductor, and arranged to extend along the flow path of the coolant such that narrow width faces of the respective alternate current conductors are opposed to the vertical direction, and wide width faces are opposed to each other, alternate current bus bars extended along the coolant path are aligned on a short side of substantially the rectangular shape of the power inverter, and an alternate current power is outputted from the short side. A space occupied by the alternate current bus bars can be reduced, a relationship of arrangement with other circuit is in order, and the power inverter can further be downsized by configuring such a structure.

Configuration 6 for resolving the problem related to an improvement in the productivity will be described below. Configuration 6 configures a structure in which the capacitor module and the power semiconductor module are fixed to the coolant path structure for forming the coolant path at the inner portion of the chassis of the power inverter, and the alternate current busbar assembly is arranged thereon. The connection of the capacitor module and the power semiconductor module can easily be carried out, and successively the connection of the power semiconductor module and the alternating busbar assembly can easily be carried out by configuring such a structure. The productivity is improved thereby. Particularly, a large current flows in the connecting portion of the capacitor module and the power semiconductor module, and therefore, the electric connection is frequently carried out by welding. First, the capacitor module and the power semiconductor module can be connected by welding, and successively the power semiconductor module and the alternate current busbar assembly can be connected by welding by fixing the alternate current busbar assembly. In the connection by welding, it is necessary to guide welding apparatus to the weld portion, and in the structure described above, the welding apparatus can be guided to the weld portion. The operability is improved by first carrying out connection by welding and next carrying out connection by solder. The structure described above not only contributes to downsizing, but the productivity is improved in a case where the electric connection is carried out by the welding step. It is not necessary to ensure an area for screwing at the terminal portion of the power semiconductor module, the power semiconductor module can further be downsized, which amounts to downsizing of the power inverter by using a welding step in the electric connection of the capacitor module and the power semiconductor module and the electric connection of the power semiconductor module and the alternate current busbar assembly.

Other configuration 7 for resolving the problem related to an improvement in the productivity will be described as follows. Configuration 7 is basically the same as the configuration explained in configuration 4 described above. Configuration 7 is that the connection portion of the signal terminal arranged along the flow path of the coolant and protruded from the power semiconductor module is arranged on further one side in the vertical direction more than the connecting portion of the direct current terminal or the alternate current terminal, and the driver circuit is arranged further on one side in the vertical direction more than the capacitor module or the alternate current bus bar in the vertical direction. The position of arranging the bus bar in which the large current flows and the position of the wiring of supplying the signal to the signal terminal are dividedly arranged in the vertical direction by constructing such a configuration. Thereby, the bus bar and the wiring can successively be integrated in the vertical direction, and the connecting operation can be carried out successively in the vertical direction. The productivity is improved thereby.

Further in configuration 7 described above, the electric connection related to the bus bar in which the large current flows is carried out by welding connection, the connection of wirings related to the signal terminal is carried out by solder connection, thereby, the welding step and the solder step are separated, the step of welding the direct current bus bar and the step of welding the alternate current bus bar can be carried out to be proximate to each other. The productivity is improved thereby.

Configuration 8 for resolving the problem related to an improvement in the reliability will be described as follows. Configuration 8 is a structure in which the cooling block of forming the coolant path for making the coolant flow is arranged in the metallic chassis, the alternate current bus bar for making the alternate current flow is fixed to the cooling block, and a current sensor for detecting a current flowing in the alternate current bus bar is fixed to the bus bar. The alternate current bus bar is cooled via the cooling block cooled by the coolant, the temperature rise of the alternate current bus bar by the heat transmitted from the motor side can be restrained and the temperature rise of the current sensor can be restrained by arranging the current sensor to the bus bar fixed to the cooling block.

For example, in a case where the power inverter is fixed to a member having a possibility of being at a temperature as in a transmission of a vehicle, the heat is transmitted via the chassis. The alternate current bus bar of supplying the alternate current power to the motor is an excellent thermal conductor since a material thereof is copper. Therefore, heat of the motor is transmitted via the alternate current bus bar, and there is a possibility of elevating the temperature of the current sensor. In configuration 8, the alternate current bus bar is fixed to the cooling block forming the coolant path, the current sensor is fixed to the alternate current bus bar, and therefore, the temperature rise of the current sensor can be restrained, and the reliability is improved.

Other configuration 9 for resolving the problem related to an improvement in the reliability will be described as follows. Configuration 9 is constructed by a configuration in which in configuration 8 described above, the alternate current busbar assembly having the fixing member and the holder is provided, and the alternate current bus bar is held and fixed by the holder of the alternate current busbar assembly. Configuration 9 is constructed by a configuration in which the alternate current busbar assembly is fixed to the cooling block by the fixing means of the alternate current busbar assembly. The alternate current busbar assembly per se is fixed to the cooling block by the fixing member.

Integration of the alternate current busbar assembly is facilitated by the configuration, and the alternate current busbar assembly can be cooled by the cooling block. The alternate current bus bar can efficiently be cooled. The temperature rise of the current sensor can be restrained, and therefore, the reliability of the current sensor and the reliability of the total of the power inverter are improved. The current sensor has a temperature property weak at a high temperature and a measure of the heat of the current sensor is an important problem to be resolved.

Other configuration 10 for resolving the problem related to an improvement in the reliability will be described as follows. Configuration 10 is constructed by a configuration in which in addition to the coolant path for cooling the power semiconductor module by the flow of the coolant, a configuration of cooling the power semiconductor module by an outer peripheral face of the coolant path is provided and a circuit which is intended to cool is arranged at the outer peripheral face. Further specifically, configuration 10 is constructed by a configuration in which the power semiconductor module is inserted into the coolant path for cooling the power semiconductor module by the flow of the coolant, and a circuit which is intended to be cooled is brought into close contact with the outer peripheral face for cooling the circuit by the outer peripheral face. As the circuit which is intended to be cooled, for example, as in the explanation of the embodiment, there is the semiconductor module for accessories for generating the alternate current power supplied to the motor for accessories mounted on a vehicle such as a compressor mounted on a vehicle, and configuration 10 is constructed by a configuration in which the semiconductor module for accessories is fixed to the outer peripheral face for cooling the semiconductor module.

In an embodiment as follows, a space of reserving water which is a coolant is formed at the cooling block which forms the coolant path, and the semiconductor module for accessories is arranged at an outer peripheral face of the space of reserving the water at inside of the outer peripheral face of the cooling block. The power semiconductor module is cooled and the semiconductor module for accessories can efficiently be cooled by the configuration.

In addition to the configuration 10 described above, the power semiconductor module, the semiconductor module for accessories and the capacitor module can efficiently be cooled by forming a concave portion of containing the capacitor module for smoothing at the cooling block and fixing the capacitor module to the cooling block, these can compactly be arranged, and further downsizing and efficient cooling of the power inverter can be made to be compatible with each other. These are fixed to the cooling block, and therefore, the configuration is excellent also in a performance of integrating the power inverter.

Next, an explanation will be given of embodiments according to the present invention in reference to the drawings. FIG. 1 is a system diagram of applying a power inverter according to the present invention to a so-called vehicle for hybrid which runs by using both of an engine and a motor. The power inverter according to the present invention can be applied not only to a vehicle for hybrid but a so-called electric vehicle which runs only by a motor, and can be used as a power inverter for driving a motor that is used in a general industrial machine. However, as described above or explained below, the power inverter according to the present invention achieves an excellent effect in various viewpoints of a view point of downsizing, a view point of reliability and the like when the power inverter is applied particularly to the vehicle described above and the electric vehicle described above. The power inverter applied to the vehicle for hybrid is configured substantially the same as the power inverter applied to the electric vehicle, and an explanation will be given of the power inverter which is applied to the hybrid electric vehicle as a representative example.

FIG. 1 is a diagram showing a control block of a hybrid electric vehicle (hereinafter, described as "HEV"). An engine EGN, a motor generator MG1, and a motor generator MG2 generate a torque for driving a vehicle. The motor generator MG1 and the motor generator MG2 have a function of not only generating a rotating torque but converting a mechanical energy that is applied to the motor generator MG1 or the motor generator MG2 from outside into an electric power.

The motor generator MG1 or MG2 is, for example, a synchronous machine or an induction machine, and is operated as a motor and also as a generator by a driving method as described above. In a case where the motor generator MG1 or MG2 is mounted on a vehicle, it is preferable to obtain a high output despite a small-sized configuration, and a synchronous electrical motor of a permanent magnet type using a magnet of neodymium or the like is suitable therefor. Also, a synchronous electrical motor of a permanent magnet type has inconsiderable heat generation of a rotor in comparison with that of an induction electrical motor, and is excellent for a vehicle also in this respect.

Output torques on an output side of the engine EGN and the motor generator MG2 are transmitted to the motor generator MG1 via a power transfer TSM, and a rotating torque from the power transfer TSM or a rotating torque generated by the motor generator MG1 is transmitted to a wheel via a transmission TM and a differential gear DEF. On the other hand, when a regenerative braking is operated, a rotating torque is transmitted from the wheel to the motor generator MG1, and an alternate current power is generated based on the supplied rotating torque. The generated alternate current power is converted into a direct current power by a power inverter 200 as described later, and charges a battery 136 for high voltage use, and the charged power is used again as a driving energy. Also, in a case where the power charged in the battery 136 for high voltage use is reduced, a rotational energy generated by the engine EGN can be converted into an alternate current power by the motor generator MG2, successively, the alternate current power can be converted into a direct current power by the power inverter 200, and can charge the battery 136. Transmission of the mechanical energy from the engine EGN to the motor generator MG2 is carried out by the power transfer TSM.

Next, an explanation will be given of the power inverter 200. Inverter circuits 140 and 142 are electrically connected via the battery 136 and direct current connectors 138 and an electric power is transferred between the battery 136 and the inverter circuit 140 or 142. In a case where the motor generator MG1 is operated as a motor, the inverter circuit 140 generates an alternate current power based on a direct current power supplied from the battery 136 via the direct current connector 138, and the alternate current power is supplied to the motor generator MG1 via an alternating terminal 188. A configuration consisting of the motor generator MG1 and the inverter circuit 140 is operated as a first motor generator unit. Similarly, in a case where the motor generator MG2 is operated as a motor, the inverter circuit 142 generates an alternate current power based on the direct current power supplied from the battery 136 via the direct current connector 138, and the alternate current power is supplied to the motor generator MG2 via an alternate current terminal 159. A configuration consisting of the motor generator MG2 and the inverter circuit 142 is operated as a second motor generator unit. There are a case where both of the first motor generator unit and the second motor generator unit are driven as motors or generators, and a case where the both are properly used in accordance with a driving state. Also, one of them can be stopped without driving the same. Incidentally, according to the present embodiment, a vehicle can be driven only by a power of the motor generator MG1 by operating the first motor generator unit as a motor unit by the power of the battery 136. According to the present embodiment, the battery 136 can be charged by generating a power by operating the first motor generator MG1 or the second motor generator unit as a generator unit by a power of the engine 120 or a power from the wheel.

The battery 136 is used also as a power source for driving a motor for accessories 195. The motor for accessories is, for example, a motor of driving a compressor of an air-conditioner, or a motor of driving a hydraulic pump for control. The direct current power from the battery 136 is supplied to a module for accessories 350, an alternate current power is generated by the module for accessories 350, and the alternate current power is supplied to the motor for accessories 195 via an alternate current terminal 120. The module for accessories 350 has a circuit configuration and a function basically similar to those of the inverter circuit 140 or 142, and controls a phase, a frequency, and an electric power of an alternate current that is supplied to the motor for accessories 195. A capacity of the motor for accessories is smaller than a capacity of the motor generator MG1 or MG2. Therefore, a maximum conversion power of the module for accessories 350 is smaller than that of the inverter circuits 140 or 142. However, a basic configuration and a basic operation of the module for accessories 350 are substantially the same as those of the inverter circuit 140 or 142 as described above. The power inverter 200 includes a capacitor module for smoothing a direct current power supplied to the inverter circuit 140, the inverter circuit 142, or an inverter circuit 350B.

The power inverter 200 includes a connector 21 for communication for receiving an instruction from an upper control device or transmitting data indicating a state to the upper control device. A control circuit 172 calculates a control amount of the motor generator MG1, the motor generator MG2, or the motor for accessories 195 based on the instruction from the connector 21, calculates whether the motor generator MG1, the motor generator MG2, or the motor for accessories 195 is driven as a motor or a generator, generates a control pulse based on a result of calculation, and supplies the control pulse to a driver circuit 174 or a driver circuit 350A of the module for accessories 350. The module for accessories 350 may have an exclusive control circuit. In this case, the exclusive control circuit generates a control pulse based on the instruction from the connector 21, and supplies the control pulse to the driver circuit 350A of the motor for accessories 350. The driver circuit 174 generates a drive pulse for controlling the inverter circuit 140 or the inverter circuit 142 based on the control pulse. Also, the driver circuit 350A generates a control pulse for driving the inverter circuit 350B of the module for accessories 350.

Next, an explanation will be given of a configuration of an electrical circuit of the inverter circuit 140 or the inverter circuit 142 in reference to FIG. 2. Also a circuit configuration of the inverter 350B of the module for accessories 350 shown in FIG. 1 is basically similar to a circuit configuration of the inverter circuit 140. Therefore, an explanation of the specific circuit configuration of the inverter 350 is omitted in FIG. 2, and an explanation will be given of the inverter circuit 140 as a representative example. However, an output power of the module for accessories 350 is small. Therefore, a semiconductor chip configuring an upper arm or a lower arm of each phase explained below and a circuit connecting the chip are arranged to be summarized in the module for accessories 350.

Circuit configurations and operations of the inverter circuit 140 and the inverter circuit 142 are extremely similar to each other. Therefore, an explanation will be given of the inverter circuit 140 as a representative.

In the following, an insulated gate bipolar transistor is used as a semiconductor element, and hereinafter, the insulated gate bipolar transistor is abbreviated as IGBT. The inverter circuit 140 includes series circuits 150 of upper and lower arms each consisting of IGBT 328 and a diode 156 operated as the upper arm and IGBT 330 and a diode 166 operated as the lower arm in correspondence with three phases consisting of U phase, V phase, and W phase of an alternate current power to be outputted. The three phases correspond to those of respective phases of phase windings of an armature winding of the motor generator MG1. The respective series circuits 150 of the upper and lower arms of the three phases output alternate currents from neutral points 169 which are middle point portions of the series circuits, and the alternate currents are connected to alternate current bus bars 802 or 804 explained below which are alternate current power lines to the motor generator MG1 by passing alternate current terminals 159 and alternate current connectors 188.

A collector 153 of IGBT 328 of the upper arm is connected to a capacitor terminal 506 on a positive electrode side of the capacitor module 500 via a positive pole terminal 157, and an emitter of IGBT 300 of the lower arm is connected to a capacitor terminal 504 on a negative electrode side of the capacitor module 500 via a negative electrode terminal 158, respectively electrically.

As described above, the control circuit 172 receives a control instruction from the upper control device via the connector 21, generates the control pulse which is a control signal for controlling IGBT 328 or IGBT 330 configuring the upper arm or the lower arm of the series circuit 150 of each phase configuring the inverter circuit 140 based thereon, and supplies the control pulse to the driver circuit 174. The driver circuit 174 supplies a drive pulse for controlling IGBT 328 or IGBT 330 configuring the upper arm or the lower arm of the series circuit of each phase to IGBT 328 or IGBT 330 of each phase based on the control pulse. IGBT 218 or IGBT 330 carries out a conducting or breaking operation based on the drive pulse from the driver circuit 174, and converts a direct current power supplied from the battery 136 into a 3 phase alternate current power, and the converted power is supplied to the motor generator MG1.

IGBT 328 includes the collector 153, an emitter 155 for signal, and a gate 154. IGBT 330 includes a collector 163, an emitter 165 for signal, and a gate 164. IGBT 330 includes a collector 163, and an emitter 165 for signal, and a gate 164. A diode 156 is electrically connected between the collector 163 and the emitter. A diode 166 is electrically connected between the connector electrode 163 and the emitter. As a power semiconductor element for switching, a metal oxide semiconductor field effect transistor (hereinafter, abbreviated as MOSFET) may be used. In this case, the diode 156 and the diode 166 are not needed. As the power semiconductor element for switching, IGBT is suitable for a case where a direct current voltage is comparatively high, and MOSFET is suitable for a case where the direct current voltage is comparatively low.

The capacitor module 500 includes the plural capacitor terminals 506 on a positive electrode side, the plural capacitor terminals 504 on a negative electrode side, a power source terminal 509 on the positive electrode side, and a power source terminal 508 on the negative electrode side. A direct current power of a high voltage from the battery 136 is supplied to the power source terminal 509 on the positive electrode side and the power source terminal 508 on the negative electrode side via the direct current connector 138, and is supplied to the inverter circuit 140, the inverter circuit 142, and the module for accessories 350 from the plural capacitor terminals 506 on the positive electrode side and the plural capacitor terminals 504 on the negative electrode side of the capacitor module 500. On the other hand, a direct current power converted from the alternate current power by the inverter circuit 140 or the inverter circuit 142 is supplied to the capacitor module 500 from the capacitor terminal 506 on the positive electrode side and the capacitor terminal 504 on the negative electrode side, supplied to the battery 136 from the power source terminal 509 on the positive electrode side or the power source terminal 508 on the negative electrode side via the direct current connector 138, and is charged to the battery 136.

The control circuit 172 includes a microcomputer for calculating to process switching timings of IGBT 328 and IGBT 330. As information inputted to the microcomputer, there are a target torque value requested to the motor generator MG1, a current value supplied from the upper and lower arms series circuit 150 to the motor generator MG1, and a magnetic pole position of the rotor of the motor generator MG1. The target torque value is based on an instruction signal outputted from the upper control device, not illustrated. The current value is detected based on a detecting signal by a current sensor 180. The magnetic pole position is detected based on a detecting signal outputted from a rotating magnetic pole sensor (not illustrated) of a resolver or the like provided at the motor generator MG1. Although according to the present embodiment, there is pointed out, as an example, a case where the current sensor 180 detects three phases of current values, two-phase amount of current values may be detected, and three-phase amount of currents may be calculated by a calculation.

The microcomputer in the control circuit 172 calculates current instruction values of d, q axes of the motor generator MG1 based on the target torque value, calculates voltage instruction values of d, q axes based on differences of the calculated current instruction values of d, q axes, and detected current values of d, q axes, and converts the calculated voltage instruction values of d, q axes into voltage instruction values of U phase, V phase, W phase based on the detected magnetic pole positions. The microcomputer generates a pulse-like modulated wave based on a comparison of a fundamental wave (sine wave) based on the voltage instruction values of U phase, V phase, W phase and a carrier wave (triangular wave), and outputs the generated modulated wave to the driver circuit 174 as a PWM (pulse width modulation) signal. In a case of driving the lower arm, the driver circuit 174 outputs a drive signal provided by amplifying the PWM signal to the gate of IGBT 330 of the corresponding lower arm. Also, in a case of driving the upper arm, the driver circuit 174 amplifies the PWM signal after shifting a level of a reference potential of the PWM signal to a level of a reference potential of the upper arm, and outputs the amplified PWM signal to the gate of IGBT 328 of the corresponding upper arms as a drive signal.

A control unit 170 protects the upper and lower arms series circuit 150 by detecting abnormalities (excess current, excess voltage, excess temperature etc.). For such purpose, the control circuit 172 is inputted with sensing information. For example, a corresponding drive unit (IC) is inputted with information of currents flowing in respective emitters of IGBT 328 and IGBT 330 from the emitter 155 for signal and the emitter 165 for signal of the respective arms. Thereby, each drive unit (IC) detects excess current, stops switching operations of corresponding IGBT 328 and IGBT 330 in a case where the excess current is detected, and protects corresponding IGBT 328, IGBT 330 from excess current. The microcomputer is inputted with information of a temperature of the upper and lower arms series circuit 150 from a temperature sensor (not illustrated) provided at the upper and lower arms series circuit 150. Also, the microcomputer is inputted with information of a voltage on a direct current positive pole side of the upper and lower arms series circuit 150. The microcomputer detects excess temperature and detects excess voltage based on information of these, and stops switching operations of all of IGBT 328, IGBT 330 in a case where excess temperature or excess voltage is detected.

Figure 3:
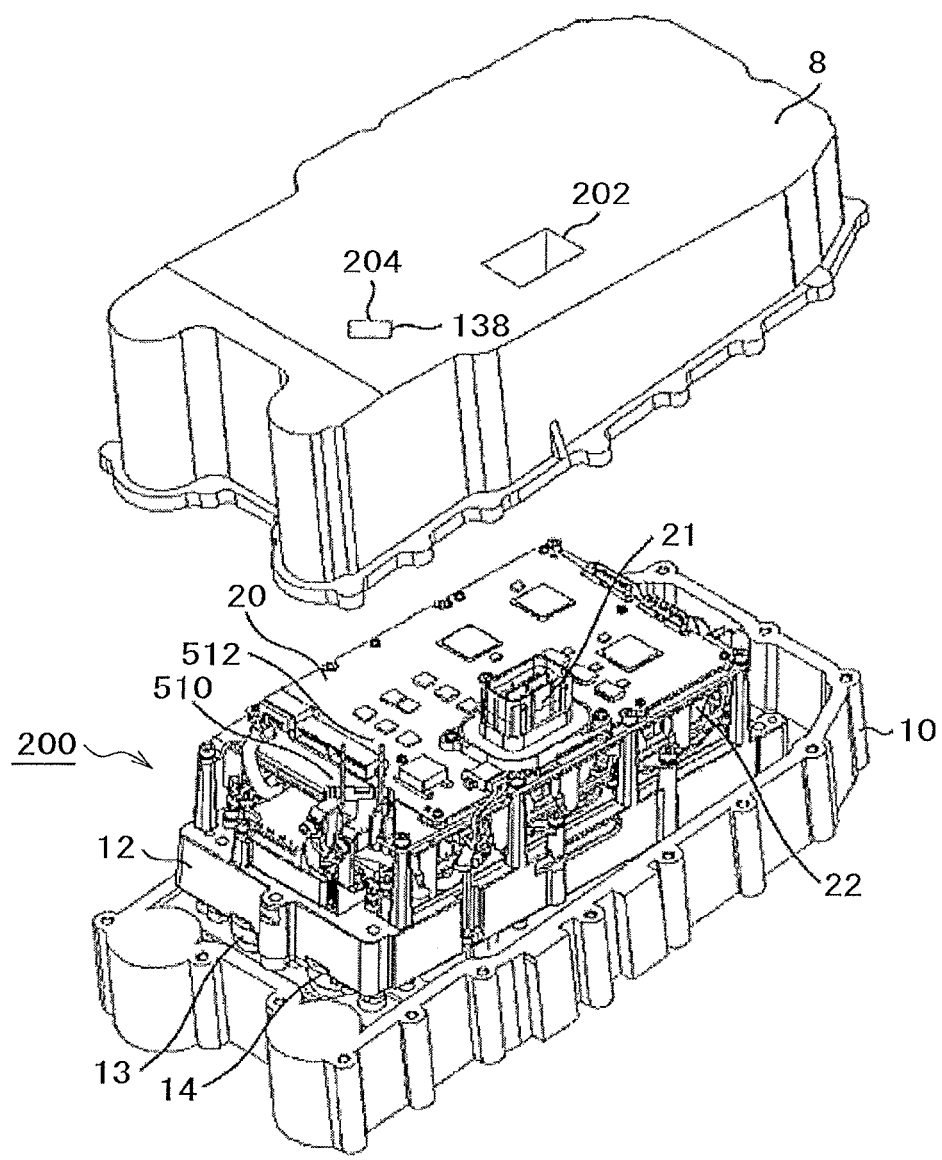
FIG. 3 is a disassembled perspective view for explaining a configuration of a power inverter.

FIG. 3 shows a disassembled perspective view of the power inverter 200 as an embodiment according to the present invention. The power inverter 200 includes a chassis 10 having a bottom made of aluminum and a lid 8 for containing circuit parts of the power inverter 200 fixed to the transmission TM. The power inverter 200 achieves an effect of being easy to be attached to a vehicle and easy to be produced by making shapes of a bottom face and an upper face of the power inverter 200 substantially by a rectangular shape. A cooling block 12 holds a power semiconductor module 300 described later and the capacitor module 500, and cools the power semiconductor module 300 and the capacitor module 500 by a coolant. The cooling block 12 is fixed to the chassis 10, and is provided with an inlet pipe 13 and an outlet pipe 14 at a bottom portion of the chassis 10. Water which is the coolant flows into the cooling block 12 from the inlet pipe, is used for cooling, thereafter, flows out from the outlet pipe 14.

The lid 8 contains circuit parts configuring the power inverter 200, and is fixed to the chassis 10. An upper portion of an inner side of the lid 8 is arranged with a control circuit board 20 mounted with the control circuit 172. The lid 8 is provided with a first opening 202 and a second opening 204 communicating with outside, the connector 21 is connected to an outside control device via the first opening 202, and transmits signals between the control circuit 172 provided at the control circuit board 20 and an external control device of the upper control device or the like. A direct current power at a low voltage for operating control circuits in the power inverter 200 is supplied from the connector 21. The second opening 204 is provided with the direct current connector 138 for transferring the direct current power to and from the battery 136, and a negative electrode side power line 510 and a positive electrode side power line 512 for supplying a high voltage direct current power to inside of the power inverter 200 electrically connect the direct current connector 138, the capacitor module 500 and the like for transferring a direct current power to and from the battery 136.

The connector 21, the negative electrode side power line 510, and the positive electrode side power line 512 are extended to a bottom face of the lid 8, the connector 21 is protruded to the first opening 202, and front end portions of the negative electrode side power line 510 and the positive electrode side power line 512 are protruded from the second opening 204 to configure terminals of the direct current connectors 138. The lid 8 is provided with seal members (not illustrated) at surroundings of the first opening 202 and the second opening 204 of an inner wall thereof. Although a fitting face of the terminal of the connector 21 or the like is directed in various directions depending on kinds of vehicles, particularly in a case of intending to mount on a small-sized vehicle, it is preferable to direct the fitting face in an upper direction from viewpoints of a restriction of a size in an engine room and an assembling performance. Particularly, in a case where the power inverter 200 is arranged on an upper side of the transmission TM as in the present embodiment, an operating performance is improved by protruding the fitting face to a side opposed to a side of arranging the transmission TM. It is necessary to seal the connector 21 from an outside atmosphere. A seal member in contact with the lid 8 can press the connector 21 when the lid 8 is integrated to the chassis 10 by configuring to integrate the lid 8 to the connector 21 from the upper direction, and the airtightness is improved.

Figure 4:
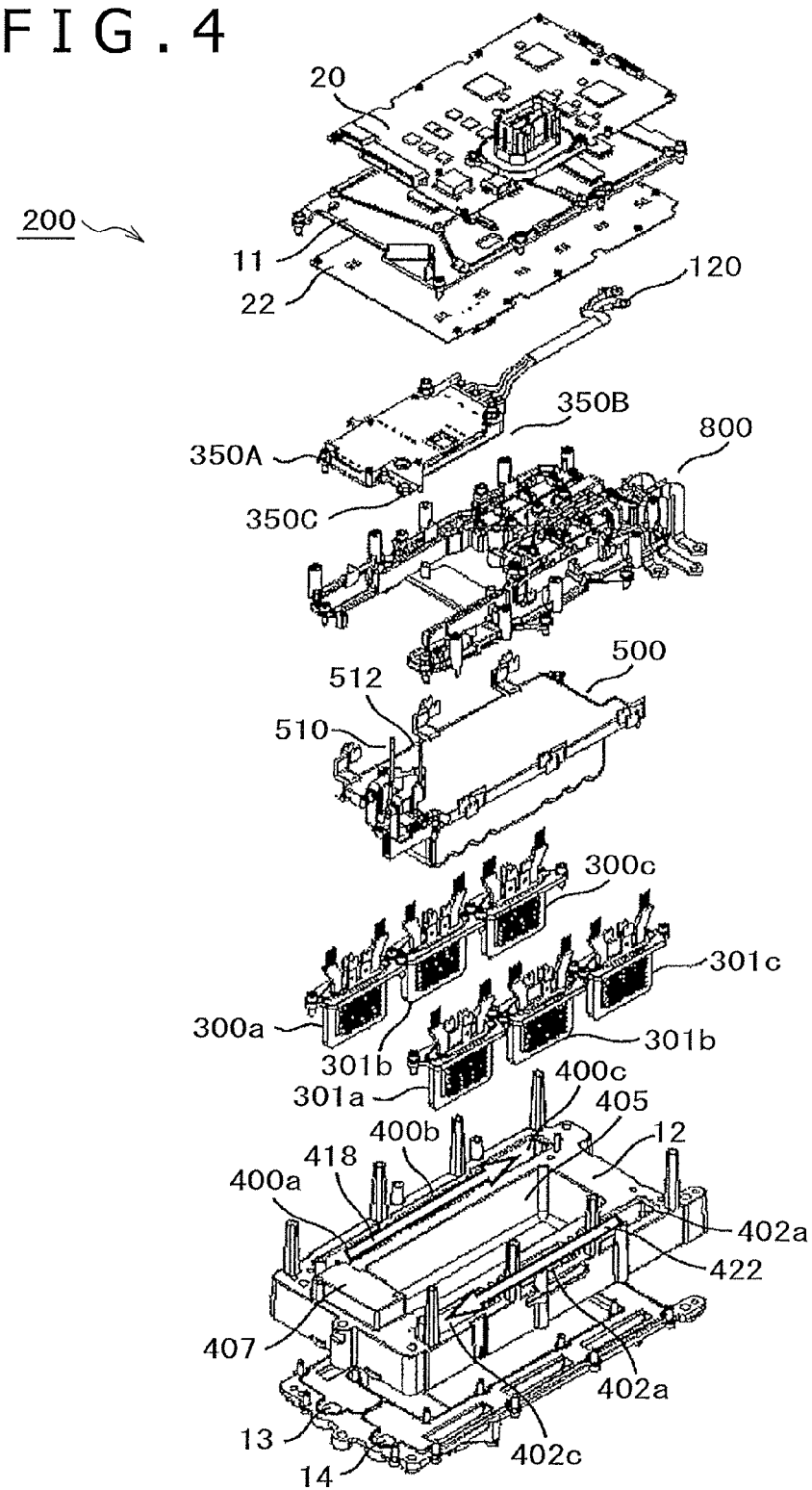
FIG. 4 is a perspective view disassembled into constituent elements for explaining a total configuration of the power inverter.

FIG. 4 is a perspective view disassembled for assisting to understand a configuration contained to inside of the chassis 10 of the power inverter 200. As shown in FIG. 5, the cooling block 12 is formed with a coolant path 19 to be along both sides of the cooling block 12. An upper face on one side of the coolant path 19 is formed with opening portions 400a through 400c along a flow direction 418 of the coolant, and an upper face of the coolant path 19 on the other side is formed with opening portions 402a through 402c along a flow direction 422 of the coolant. The opening portions 400a through 400c are closed by power semiconductor modules 300a through 300c inserted. The inserted opening portions 402a through 402c are closed by power semiconductor modules 301a through 301c inserted.

A containing space 405 for containing the capacitor module 500 is formed between flow paths on one side and on the other side formed by the cooling block 12, and the capacitor module 500 is contained in the containing space 405. Thereby, the capacitor module 500 is cooled by a coolant flowing in the coolant path 19. The capacitor module 500 can efficiently be cooled since the capacitor module 500 is interposed between the coolant path 19 for forming the flow direction 418 of the coolant and the coolant path 19 for forming the flow direction 422 of the coolant. The flow path of making the coolant flow is formed along an outer side face of the capacitor module 500. Therefore, a cooling efficiency is increased, an arrangement of the coolant path, the capacitor, module 500, and the power semiconductor modules 300 and 301 are regularly prepared, and the total is further downsized. Also, the coolant path 19 is arranged along long sides of the capacitor module 500, a distance between the coolant path 19 and the power semiconductor modules 300 and 301 inserted to be fixed to the coolant path 19 becomes substantially constant. Therefore, circuit constants of the smoothing capacitor and the power semiconductor module circuit are easy to be balanced in respective layers of three phases to thereby configure the circuit which is easy to reduce a spike voltage. According to the present embodiment, water is the most suitable as the coolant. However, other than water can be used, and therefore, in the following, the term of the coolant is described.

The cooling block 12 is provided with a cooling unit 407 including a space of changing the flow of the coolant at inside thereof at a position opposed to the inlet pipe 13 and the outlet pipe 14. The cooling unit 407 is formed integrally with the cooling block 12, and is used for cooling the module for accessories 350 according to the present embodiment. The module for accessories 350 is fixed to a cooling surface which is an outer peripheral face of the cooling unit 407, accumulates the coolant in a space formed on an inner side of the cooling surface. The cooling unit 407 is cooled by the coolant, and a temperature rise of the module for accessories 350 is restrained. The coolant is a coolant flowing in the coolant path 19, and the module for accessories 350 is cooled along with the power semiconductor modules 300 and 301 and the capacitor module 500. A busbar assembly 800 described later is arranged on both sides of the module for accessories 350. The busbar assembly 800 includes an alternate current bus bar 186 and a holder, holds and fixes a current sensor 180. Details thereof will be described later.

In this way, the space 405 of containing the capacitor module 500 is provided at a center portion of the cooling block 12, the coolant path 19 is provided to interpose the containing space 405, the power semiconductor modules 300a through 300c and the power semiconductor modules 301a through 301c for driving the vehicle are arranged respectively at the coolant path 19, and the module for accessories 350 is arranged at the upper face of the cooling block 12. Thereby, the modules can efficiently be cooled in a small space and a total of the power inverter can be downsized.

The coolant path 19 achieves an effect of strengthening a mechanical strength in addition to the cooling effect by making a main structure of the coolant path 19 of the cooling block 12 by casting an aluminum material integrally with the cooling block 12. The cooling block 12 and the coolant path 19 become an integrated structure by making the coolant path 19 by casting aluminum, a thermal conduction is excellent and the cooling efficiency is improved. The coolant path 19 is finished by fixing the power conductor modules 300a through 300c and the power semiconductor modules 301a through 301c to the coolant path 19, and a water leak test of the water path is carried out. In a case where the coolant path 19 is acceptable in the water leak test, next, there can be carried out an operation of attaching the capacitor module 500, the module for accessories 350, and the boards. In this way, it is configured to be able to carry out an operation of arranging the cooling block 12 to the bottom portion of the power inverter 200, next, fixing necessary parts of the capacitor module 500, the module for accessories 350, the busbar assembly 800, the boards and the like successively from above, and the productivity and the reliability are improved.

A driver circuit board 22 is arranged on an upper side, that is, the lid side of the module for accessories 350, and the busbar assembly 800. A metal base plate 11 is arranged between the driver circuit board 22 and the control circuit board 20. The metal base plate 11 achieves a function of electromagnetic shielding of a group of circuits mounted on the driver circuit board 22 and the control circuit board 20, and has an operation of escaping heat generated by the driver circuit board 22 and the control circuit board 20 to cool. The metal base plate 11 carries out an operation of increasing a mechanical resonance frequency of the control circuit board 20. That is, the metal base plate 11 can arrange screw fastening portions for fixing the control circuit board 20 to the metal base plate 11 at short intervals. A distance between support points can be shortened in a case where a mechanical vibration is generated, and the resonance frequency can be increased. The resonance frequency of the control circuit board 20 can be made higher than a vibration frequency transmitted from the transmission, and therefore, an influence of the vibration is made to be difficult to be effected and the reliability is improved.

FIG. 5 is an explanatory view for explaining the cooling block 12 and is a view viewing the cooling block 12 shown in FIG. 4 from below. The cooling block 12 and the coolant path 19 which is formed along the containing space 405 (refer to FIG. 4) of the capacitor module 500 at inside of the cooling block 12 are integrally cast. A lower face of the cooling block 12 is formed with a single communicating opening portion 404, and the opening portion 404 is closed by a lower cover 420 having an opening at a center portion thereof. A seal member 409a and a seal member 409b are provided between the lower cover 420 and the cooling block 12 and maintain the airtightness.

The lower cover 420 is formed with an inlet hole 401 for inserting the inlet pipe 13 (refer to FIG. 4), and an outlet hole 403 for inserting the outlet pipe 14 (refer to FIG. 4). The lower cover 420 is formed with convex portions 406 protruded in a direction of arranging the transmission TM. The convex portions 406 are provided in correspondence with the power semiconductor modules 300a through 300c and the power semiconductor modules 301a through 301c. The coolant flows to the first flow path portions 19a formed along a side in a transverse direction of the cooling block 12 by passing the inlet hole 401 in a direction of the flow direction 417 indicated by a dotted line. The first flow path portion 19a forms a space of changing the flow of the coolant, and the coolant impinges on an inner face of the cooling unit 407 to change a direction of flow in the space. When the coolant impinges on the inner face, the coolant carries out an operation of depriving heat of the cooling unit 407. The coolant flows in the second flow path portion 19b formed along a side in a longitudinal direction of the cooling block 12 as in a flow direction 418. The coolant flows in a third flow path portion 19c formed along a side in a transverse direction of the cooling block 12 as in a flow direction 421. The third flow path portion 19c forms a fold back flow path. The coolant flows in the fourth flow path portion 19d along a side in a longitudinal direction of the cooling block forming structure 12 as in a flow direction 422. The fourth flow path portion 19d is provided at a position opposed to the second flow path portion 19b by interposing the capacitor module 500. The coolant flows out to the outlet pipe 14 by passing the fifth flow path portion 19e formed along a side in a transverse direction of the cooling block 12 as in a flow direction 423 and the outlet hole 403.

All of the first flow path portion 19a, the second flow path portion 19b, the third flow path portion 19c, the fourth flow path portion 10d, and the fifth flow path portion 19e are formed to be larger in a depth direction than in a width direction. The power semiconductor modules 300a through 300c are inserted from opening portions 400a through 400c (refer to FIG. 4) formed on an upper face side of the cooling block 12, and are contained in a containing space at inside of the second flow path portion 19b. There is formed a middle member 408a for preventing the flow of the coolant from being stagnant between a space of containing the power semiconductor module 300a and a space of containing the power semiconductor module 300b. Similarly, there is formed a middle member 408b for preventing the flow of the coolant from being stagnant between a space of containing the power semiconductor module 300b and a space of containing the power semiconductor module 300c. The middle member 408a and the middle member 408b are formed such that main faces thereof are along the flow direction of the coolant. Also, the fourth flow path portion 19d is formed with a space of containing the power semiconductor modules 301a through 301c and middle members similar to the second flow path portion 19b. The cooling block 12 is formed such that the opening portion 404 and the opening portions 400a through 400c as well as 402a through 402c are opposed to each other, and therefore, is configured to be easy to produce by casting aluminum.

The lower cover 420 is provided with a support portion 410a and a support portion 410b brought into contact with the chassis 10 for supporting the power inverter 200. The support portion 410a is provided to be proximate to one end face of the lower cover 420, and the support portion 410b is provided to be proximate to the other end face of the lower cover 420. Thereby, the cooling block 12 of the power inverter 200 can solidly be fixed to an inner wall of the chassis 10 formed in conformity with circular column shapes of the transmission TM and the motor generator MG1.

The support portion 410b is configured to support resistor 450. The resistor 450 is for discharging an electric charge that is charged to a capacitor cell in consideration of protection of a passenger and safety in maintenance. The resistor 450 is configured to be able to discharge electricity at high voltage continuously. It is necessary to construct a configuration giving a consideration such that a damage to a vehicle is minimized even in a case where some abnormality is accidentally brought about. That is, in a case where the resistor 450 is arranged at surroundings of the power semiconductor module, the capacitor module, the driver circuit boards and the like, there is conceivable a possibility of spreading flame at vicinities of major parts in a case where a malfunction of heat generation, ignition or the like is accidentally brought about in the resistor 450.

Hence, according to the present embodiment, the power semiconductor modules 300a through 300c, the power semiconductor modules 301a through 301c, and the capacitor module 500 are arranged on a side opposed to the chassis 10 containing the transmission TM by interposing the cooling block 12 therebetween, and the resistor 450 is arranged in a space between the cooling block 12 and the chassis 10. Thereby, the resistor 450 is arranged in a closed space surrounded by the cooling block 12 and the chassis 10 formed by metals. An electric charge stored in the capacitor cell at inside of the capacitor module 500 is controlled to discharge to the resistor 450 via wirings passing a side portion of the cooling block 12 by a switching operation by switching means mounted on the driver circuit board 22 shown in FIG. 4. According to the present embodiment, the electric charge is controlled to discharge at high speed by the switching means. The cooling block 12 is provided between the driver circuit board 22 of controlling the discharge and the resistor 450, and therefore, the driver circuit board 22 can be protected from the resistor 450. The resistor 450 is fixed to the lower cover 420, and therefore, the resistor 450 is provided at a position very near to the coolant path 19 thermally, and therefore, abnormal heat generation of the resistor 450 can be restrained.

An explanation will be given of detailed configurations of the power semiconductor modules 300a through 300c and the power semiconductor modules 301a through 301c which are used in the inverter circuit 140 and the inverter circuit 142 in reference to FIG. 6 through FIG. 10. Both of the power semiconductor modules 300a through 300c and the power semiconductor modules 301a through 301c are of the same structure, and an explanation will be given representatively of the structure of the power semiconductor modules 300a. In FIG. 6 through FIG. 10, a signal terminal 325U corresponds to the gate 154 and the emitter for signal 155 disclosed in FIG. 2, and a signal terminal 325L corresponds to the gate 164 and the emitter 165 disclosed in FIG. 2. A direct current positive electrode terminal 315B is the same as the positive electrode terminal 157 disclosed in FIG. 2, and a direct current negative electrode terminal 319B is the same as the negative electrode terminal 158 disclosed in FIG. 2. An alternate current terminal 321 is the same as the alternate current terminal 159 disclosed in FIG. 2.

FIG. 6(a) is a perspective view of the power semiconductor module 300a according to the present embodiment. FIG. 6(b) is a sectional view of the power semiconductor module 300a according to the present embodiment.

The power semiconductor elements (IGBT 328, IGTB 330, diode 155, diode 166) configuring the upper and lower arms series circuit 150 are fixedly attached by pinching the power semiconductor elements from both faces thereof by a conductor plate 315 and a conductor plate 318, or a conductor plate 316 and a conductor plate 319 as shown in FIG. 7 through FIG. 9. The conductor plates are integrated with a connecting part structure 600 which is configured by integrally molding signal wirings that are the signal terminal 325U and the signal terminal 325L. The conductor plate 315 or the like is sealed by a first potting resin 348 in a state of exposing a heat radiating face thereof, and thermally contact-bonded with an insulation sheet 333 at the heat radiating face. A module primary seal structure 302 sealed by the first potting resin 348 is inserted into a module case and thermally contact-bonded to an inner face of the module case 304 which is a CAN type cooler by interposing the insulation sheet 333 therebetween. Here, the CAN type cooler is a cooler configured by a cylindrical shape having an insertion port 306 at one face thereof and a bottom at the other face.

The module case 304 is configured by an aluminum alloy material, for example, Al, AlSi, AlSiC, Al—C or the like, and is integrally molded in a seamless state. The module case 304 is configured by a structure which is not provided with an opening other than the insertion port 306, and an outer periphery of the insertion port 306 is surrounded by a flange 304B. As shown in FIG. 6(a), a first heat radiating face 307A and a second heat radiating face 307B having faces wider than the other face are arranged in a state of being respectively opposed to each other. Three faces connecting the first heat radiating face 307A and the second heat radiating face 307B opposed to each other configure faces which are hermetically closed by widths narrower than those of the first heat radiating face 307A and the second heat radiating face 307B, and the insertion port 306 is formed at the remaining one side face. A shape of the module case 304 does not need to be an accurate rectangular prism, but a corner thereof may configure a curved face as shown in FIG. 6(a).

Even when the module case 304 is inserted into the coolant path where the coolant of water, oil or the like flows, sealing against the coolant can be ensured by the flange 304B by using the metallic case having such a shape. Therefore, it can be prevented by a simple configuration that the coolant invades inside of the module case. Fins 305 are uniformly formed respectively on the first heat radiating face 307A and the second heat radiating face 307B opposed to each other. Outer peripheries of the first heat radiating face 307A and the second heat radiating face 307B are formed with curved portions 304A where thicknesses thereof are extremely thinned. At the curved portion 304A, the thickness is extremely thinned to a degree of being simply deformed by pressing the fins 305. Therefore, the productivity after inserting the module primary sealing structure 302 is promoted.

An air gap remaining at inside of the module case 304 is filled with a second potting resin 351. As shown in FIG. 8 and FIG. 9, a direct current positive electrode wiring 315A and a direct current negative electrode wiring 319A are provided for electrically connecting to the capacitor module 500, and front end portions thereof are formed with the direct current positive electrode terminal 315B (157) and the negative current positive electrode terminal 319B (158). An alternate current wiring 320 is provided for supplying an alternate current power to the motor generator MG1 or MG2, and a front end thereof is formed with an alternate current terminal 321 (159). According to the present embodiment, the direct current positive electrode wiring 315A is formed integrally with the conductor plate 315, the direct current negative electrode wiring 319A is formed integrally with the conductor plate 319, and the alternate current wiring 320 is formed integrally with the conductor plate 316.

As described above, an air gap between the conductor plate and the inner wall of the module case 304 can be reduced by thermally contact-bonding the conductor plate 315 or the like to the inner wall of the module case 304 via the insulation sheet 333, and heat generated at the power semiconductor element can efficiently be transmitted to the fin 305. Generation of a thermal stress can be absorbed by the insulation sheet 333 by providing the insulation sheet 333 with a thickness and a flexibility to some degree, which is excellent for being used in the power inverter for vehicle use having a considerable temperature change.

Figure 7A:
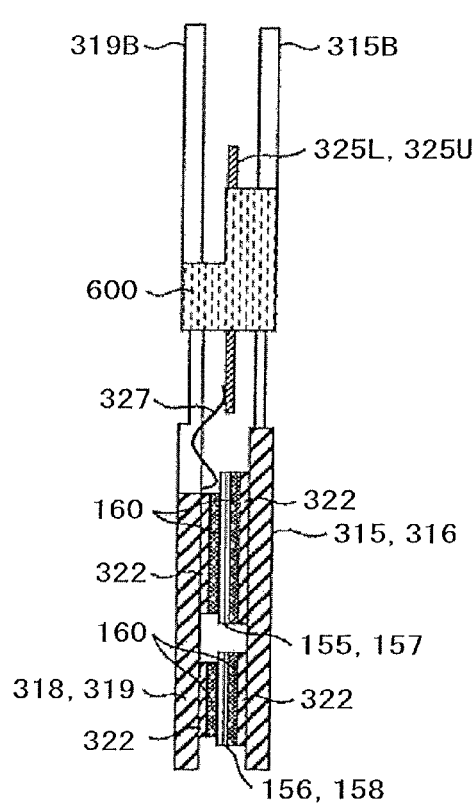
FIG. 7(a) is a sectional view of an inner portion of the power semiconductor module which removes a module case, an insulation sheet, a first potting resin, and a second potting resin for assisting understanding.
Figure 7B:
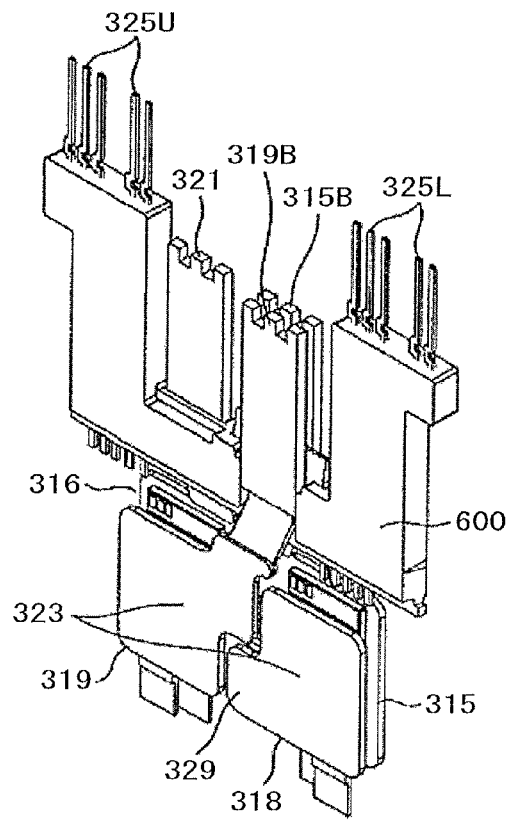
FIG. 7(b) is a perspective view for explaining a configuration of the inner portion of the power semiconductor module.
Figure 8A:
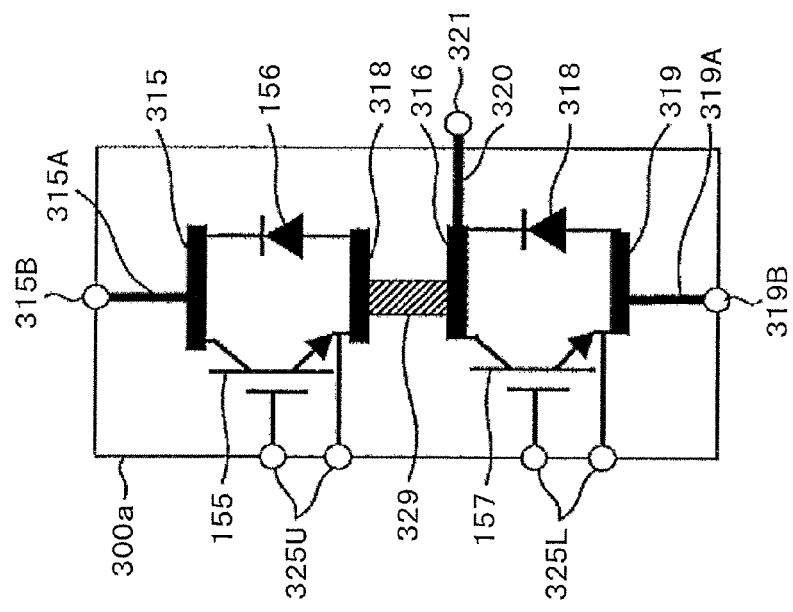
FIG. 8(a) is a disassembled view for assisting understanding of a structure of FIG. 7(b).
Figure 8B:
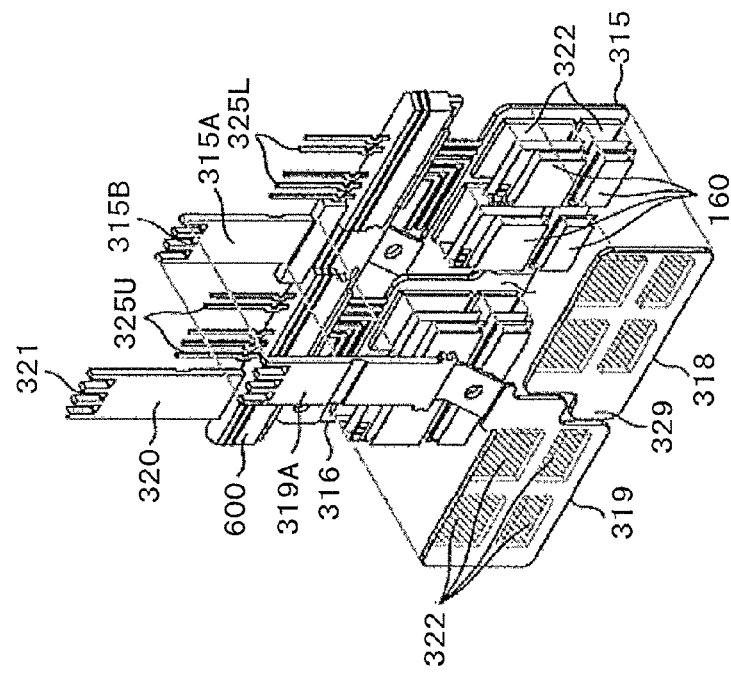
FIG. 8(b) is a circuit diagram of the power semiconductor module.

FIG. 7(a) is a sectional view of an inner portion removing the module case 304, the insulation sheet 333, the first potting resin 348, and the second potting resin 351 for assisting understanding. FIG. 7(b) is a perspective view of the inner portion. FIG. 8(a) is a disassembled view for assisting understanding of the structure of FIG. 7(b). FIG. 8(b) is a circuit diagram of a power semiconductor module 300. FIG. 9(a) is a circuit diagram for explaining an effect of reducing inductance, and FIG. 9(b) is a perspective view showing a flow of a current for explaining an operation of reducing inductance.

First, an explanation will be given of an arrangement of the power semiconductor elements (IGBT 328, IGBT 330, diode 156, diode 166) in relation to the electrical circuit shown in FIG. 8(b). As shown in FIG. 7 (b), the direct current positive electrode side conductor plate 315 and the alternate current output side conductor plate 316 are arranged in the substantially same plane state. The conductor plate 315 is fixedly attached with the collector of IGBT 328 on the upper arm side and the cathode electrode of the diode on the upper arm side. The conductor plate 316 is fixedly attached with the collector of IGBT 330 on the lower arm side and the cathode electrode of the diode 166 on the lower arm side. Similarly, the alternate current conductor plate 318 and the conductor plate 319 are arranged in the substantially the same plane state. The alternate current conductor plate 318 is fixedly attached with the emitter of IGBT 330 on the upper arm side and the anode electrode of the diode 166 on the upper arm side. The conductor plate 319 is fixedly attached with the emitter on the lower arm side and the anode electrode of the diode 166 on the lower arm side. The respective power semiconductor elements are fixedly attached respectively to element fixedly attaching portions 322 provided at the respective conductor plates via metal bonding materials 160. The metal bonding material 160 is a low temperature sintering bonding material including, for example, a solder material, a silver sheet, and fine metal particles or the like.

The respective power semiconductor elements are of a plate-like flat structure, and the respective electrodes of the power semiconductor elements are formed on front and rear faces thereof. As shown in FIG. 7(a), the respective electrodes of the power semiconductor elements are interposed by the conductor plate 315 and the conductor plate 318, or the conductor plate 316 and the conductor plate 319. That is, the conductor plate 315 and the conductor plate 318 are of a laminated layer arrangement opposed to each other substantially in parallel via IGBT 328 and the diode 156. Similarly, the conductor plate 316 and the conductor plate 319 are of a laminated layer arrangement opposed to each other substantially in parallel via IGBT 330 and the diode 166. The conductor plate 316 and the conductor plate 318 are connected via an neutral point 329. The upper arm circuit and the lower arm circuit are electrically connected by the connection, and the upper and the lower arms series circuit is formed.

The direct current positive electrode wiring 315A and the direct current negative electrode wiring 319A configure a shape extended substantially in parallel in a state of being opposed to each other via the connecting part structure 600 molded by the resin material. The signal terminal 325U and the signal terminal 325L are molded integrally with the connecting part structure 600, and extended in a direction similar to that of the direct current positive electrode wiring 315A and the direct current negative electrode wiring 319A. A thermosetting resin or a thermoplastic resin having an insulating performance is suitable for a resin material used in the connecting part structure 600. Thereby, the insulating performance among the direct current positive electrode wiring 315A, the direct current negative electrode wiring 319A, the signal terminal 325U, and the signal terminal 325L can be ensured, and high density wiring can be carried out. Currents instantaneously flowing in switching operations of the power semiconductor elements flow against each other and in reverse directions by arranging the direct current voltage electrode wiring 315A and the direct current negative electrode wiring 319A substantially in parallel in an opposed manner. Thereby, magnetic fields produced by the currents are operated to cancel each other, and low inductance formation can be carried out by the operation.

An explanation will be given of the operation of producing the low inductance formation in reference to FIG. 9(a). In FIG. 9(a), assume that the diode 166 on the lower arm side is conducted in a state of being biased in a forward direction. When the upper arm side IGBT 328 is brought into an ON state under such a state, the lower arm side diode 166 is biased in a reverse direction, and a recovery current caused by moving carriers penetrates the upper and the lower arms. At this occasion, a recovery current 306 shown in FIG. 9(b) flows in the respective conductor plates 315, 316, 318, and 319. The recovery current 360 passes the direct current positive electrode terminal 315B (157) arranged against the direct current negative terminal 319B (158), successively flows in a loop shape route formed by the respective conductor plates 315, 316, 318, and 319 as shown in a dotted line, and flows again as shown in a bold line via the direct current negative electrode terminal 319B (158) arranged against the direct current positive electrode terminal 315B (157). Eddy currents 361 flow in the first heat radiating face 307A and the second heat radiating face 307B of the module case 304 by making the current flow in the loop shape route. A wiring inductance 363 in the loop shape route is reduced by a magnetic field canceling effect generated by an equivalent circuit 362 in a current route of the eddy current 361.

The nearer the current route of the recovery current 360 to the loop shape, the more increased the inductance reducing operation. According to the present embodiment, with regard to the current route in the loop shape, the current flows in the route near to a side of the direct current positive electrode terminal 315B (157) of the conductor plate 315 as shown by the dotted line, and passes in IGBT 328 and the diode 156. With regard to the loop shape current route, the current flows in the route remote from the side of the direct current positive electrode terminal 315B (157) of the conductor plate 318 as shown by the bold line, thereafter, flows in a route remote from the side of the direct current positive electrode terminal 315B (157) of the conductor plate 316 as shown by the dotted line, and passes in IGBT 330 and the diode 166. With regard to the loop shape current route, the current flows in the route near to the side of the direct current negative wiring 319A of the conductor plate 319 as shown by the bold line. In this way, with regard to the loop shape current path, the current route nearer to the loop shape is formed by passing the route on the side near to or the side remote from the direct current positive electrode terminal 315B (157) and the direct current negative electrode terminal 319B (158).

FIG. 10(a) is a perspective view of the connecting part structure 600, and FIG. 10(b) is a perspective view of the connecting part structure 600.

The connecting part structure 600 is integrated with a signal conductor 324 by insert molding. Here, the signal conductor 324 includes the gate terminal 154 and the emitter terminal 155 on the lower arm side and the gate terminal 164 and the emitter 165 on the lower arm side (refer to FIG. 2), and the terminal for transmitting temperature information of the power semiconductor element. In explaining the present embodiment, the terminals are generally expressed as signal terminals 325U and 325L.

The signal conductor 324 is formed with the signal terminals 32513 and 325L at an end portion on one side, and formed with element side signal terminals 326U and 326L at an end portion on the other side. The element side signal terminals 326U and 326L are connected by a signal pad provided at a surface electrode of the power semiconductor element, and for example, a wire. A first sealing portion 601A configures a shape of being extended in a direction of traversing a long axis of a shape of the direct current positive electrode wiring 315A, the direct current negative electrode wiring 319A, or the alternate current wiring 320 shown in FIG. 8(a). On the other hand, a second sealing portion 601B is configured by a shape of being extended in a direction substantially in parallel with the long axis of the shape of the direct current positive electrode wiring 315A, the direct current negative electrode wiring 319A or the alternate current wiring 320. The second sealing portion 601B is configured by a sealing portion for sealing the upper arm side signal terminal 325U, and a sealing portion for sealing the lower arm side signal terminal 325L.

The connecting part structure 600 is formed such that a length thereof is longer than a length of a total of the conductor plates 315 and 316 aligned transversely, or a length of a total of the conductor plates 319 and 320 aligned transversely. That is, the length of the conductor plates 315 and 316 aligned transversely, or the length of the conductor plates 319 and 320 aligned transversely falls within a range of the length in the transverse direction of the connecting part structure 600.

The first sealing portion 601A is formed with a wiring fitting portion 602B configured by a concave shape for fitting the direct current negative electrode wiring 319A at the concave portion. The first sealing portion 601A is formed with a wiring fitting portion 602A configured by a concave shape for fitting the direct current positive electrode wiring 315A at the concave portion. The first sealing portion 601A is formed with a wiring fitting portion 602C arranged at a side portion of the wiring fitting portion 602A, configured by a concave shape for fitting the alternate current wiring 320 at the concave portion. Positioning of the respective wirings is carried out by fitting the respective wirings to the wiring fitting portions 602A through 602C. Thereby, an operation of filling the resin sealing material can be carried out after solidly fixing the wirings respectively, and the mass productivity is improved.

A wiring insulating portion 608 is protruded from between the wiring fitting portion 602A and the wiring fitting portion 602B in a direction of being remote from the first sealing portion 601A. An opposed arrangement for forming low inductance can be carried out while ensuring an insulating performance by interposing the wiring insulating portion 608 configuring a plate shape between the direct current positive electrode wiring 351A and the direct current negative electrode wiring 319A.

The first sealing portion 601A is formed with a mold pressing face 604 in contact with a mold used in sealing by a resin, and the mold pressing face 604 is formed with a protruded portion 605 for preventing leakage of resin in sealing by the resin by traveling around an outer periphery in a longitudinal direction of the first sealing portion 601. Plural ones of the protruded portions 605 are provided for promoting a resin leakage preventing effect. The protruded portions 605 are provided also at the wiring fitting portion 602A and the wiring fitting portion 602B, and therefore, a resin sealing material can be prevented from leaking from surroundings of the direct current positive electrode wiring 315A and the direct current negative electrode wiring 319A. Here, as a material of the first sealing portion 601A, the second sealing portion 601B, and the protruded portion 605, liquid crystal polymer, polybutyrene terephthalate (PBT) or polyphenylene-sulfide resin (PPS) of a thermoplastic resin which can anticipate high heat resistance is preferable in consideration of the fact that the material is installed to a mold at about 150 through 180° C.

There are provided plural through holes 606 shown in FIG. 10(b) in a longitudinal direction on a side of the power semiconductor element in a transverse direction of the first sealing portion 601A. Thereby, an anchor effect is manifested, the connecting part structure 600 is held solidly by the first potting resin 348 by making the first potting resin 348 flow into the through hole 606 to be cured, even when a stress is applied thereto by a temperature change or a mechanical vibration, the both are not exfoliated from each other. The both are difficult to be exfoliated from each other by configuring an irregular shape instead of the through hole. An effect to some degree is achieved by coating a polyimide species coating agent to the first sealing portion 601A, or roughening a surface.

At a step of sealing the first potting resin 348 in the module primary sealing structure 302, first, the connecting part structure 600 supporting the respective wirings is inserted into a mold that is previously heated to about 150 through 180° C. According to the present embodiment, the connecting part structure 600, the direct current positive electrode wiring 315A, the direct current negative electrode wiring 319A, the alternate current wiring 320, the conductor plate 315, the conductor plate 316, the conductor plate 318, and the conductor plate 319 are respectively connected solidly. Therefore, the main circuits and the power semiconductor elements are installed at prescribed positions by installing the connecting part structure 600 at a prescribed position. Therefore, the productivity is promoted and the reliability is improved.

The second sealing portion 601B is formed to be extended from a vicinity of the module case 304 to a vicinity of the driver circuit board 22. Thereby, when wirings with the driver circuit board 22 are carried out by dodging intervals among heavy current wirings, the switching control signal can normally be transmitted even when exposed under a high voltage. Even when the direct current positive electrode wiring 315A, the direct current negative electrode wiring 319A, the alternate current wiring 320, the signal terminal 325U, and the signal terminal 325L are protruded from the module case 304 in the same direction, the electric insulation can be ensured and the reliability can be ensured.

Figure 11:
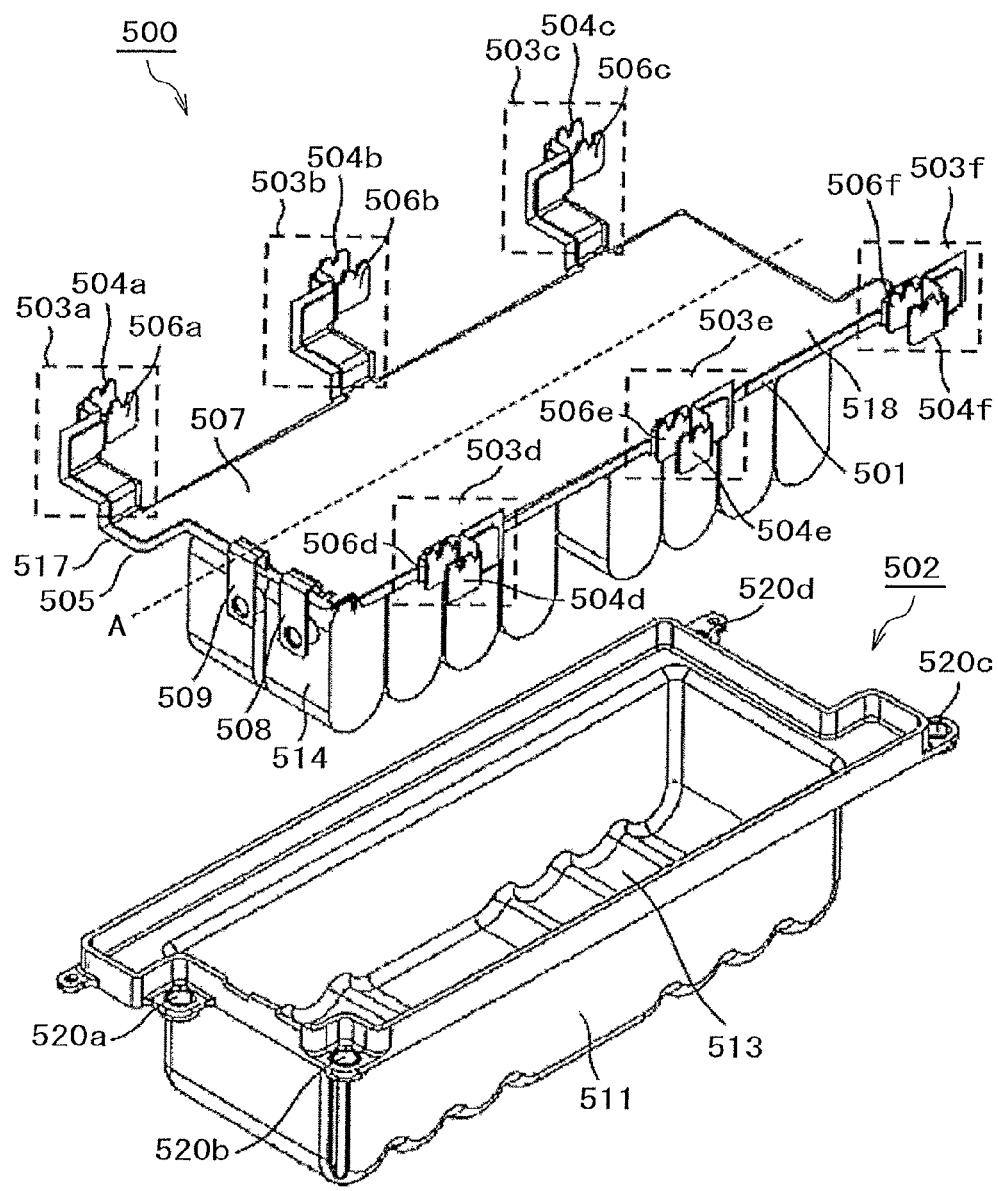
FIG. 11 is a disassembled perspective view for explaining an inner structure of a capacitor module.

FIG. 11 is a disassembled perspective view for explaining an inner structure of the capacitor module 500. A laminated layers conductor plate 501 is configured by a negative electrode conductor plate 505 and a positive electrode conductor plate 507, and an insulation sheet 517 interposed by the negative electrode conductor plate 505 and the positive electrode conductor plate 507. According to the laminated layers conductor plate 501, as explained below, magnetic fluxes are canceled by each other for currents flowing in the upper and lower arms series circuits 150 of respective phases, and therefore, low inductance formation is achieved with regard to the currents flowing in the upper and lower arms series circuits 150. The laminated layers conductor plate 501 is configured substantially by a rectangular shape. A power source terminal 508 on the negative electrode side and a power source terminal 509 on the positive electrode side are formed in a state of being raised from one side in a transverse direction of the laminated layers conductor plate 501, and respectively connected to the positive electrode conductor plate 507 and the negative conductor plate 505. The positive electrode side power source terminal 509 and the negative electrode side power source terminal 508 are supplied with a direct current power via the direct current connectors 138 as explained in reference to FIG. 2.

Capacitor terminals 503a through 503C are formed in correspondence with the positive electrode terminals 157 (315B) and the negative electrode terminals 158 (319B) of the respective power semiconductor modules 300 in a state of being raised from a side on one side in the longitudinal direction of the laminated layers conductor plate 501. Capacitor terminals 503d through 503f are formed in correspondence with the positive electrode terminals 157 (315B) and the negative electrode terminals 158 (319B) of the respective power semiconductor modules 301 in a state of being raised from a side on the other side in the longitudinal direction of the laminated layers conductor plate 501. The capacitor terminals 503a through 503f are raised in a direction of traversing a main face of the laminated layers conductor plate. The capacitor terminals 503a through 503c are respectively connected to the power semiconductor modules 300a through 300c. The capacitor terminals 503d through 503f are respectively connected to the power semiconductor modules 301a through 301c. A portion of the insulation sheet 517 is provided between a negative electrode side capacitor terminal 504a and a positive electrode side capacitor terminal 506a configuring the capacitor terminal 503a, and insulation is ensured. The same goes with other capacitor terminals 503b through 503f. According to the present embodiment, the negative electrode plate 505, the positive electrode plate 507, the battery negative electrode side terminal 508, the battery positive electrode side terminal 509, and the capacitor terminals 503a through 503f are configured by plates made of a metal which are formed integrally, and have an effect of reducing an inductance with regard to a current flowing in the upper and lower arms series circuit 150.

Plural pieces of capacitor cells 514 are provided on an inner side of the capacitor module 500 which is a lower side of the laminated layers conductor plate 501. According to the present embodiment, 8 of the capacitor cells 514 are aligned in one row along a side on one side in the longitudinal direction of the laminated layers conductor plate 501, 8 of other capacitor cells 514 are aligned in one row along a side on other side in the longitudinal direction of the laminated layer conductor plate 501, and a total of 16 pieces of the capacitor cells are provided. The capacitor cells 514 aligned along the respective sides in the longitudinal direction of the laminated layers conductor plate 501 are aligned symmetrically with a dotted line AA shown in FIG. 11 as a boundary. Thereby, in a case where a direct current that is smoothed by the capacitor cells 514 is supplied to the power semiconductor modules 300a through 300c and the power semiconductor modules 301a through 301c, a current balance between the capacitor terminals 503a through 503c and the capacitor terminals 503d through 503f is made uniform, and a reduction in the inductance of the laminated layers conductor plate 501 can be achieved. The current can be prevented from flowing locally in the laminated layers conductor plate 501, and therefore, a thermal balance is made uniform and also the heat resistance can be improved.

A number of the capacitor cells 514 are arranged in a direction along the coolant path. Therefore, the capacitor cells 514 tend to be easy to be made uniform with regard to the power modules 300 and the upper and lower arms series circuits 150 of U phase, V phase, and W phase of the power semiconductor modules 301 which are arranged along the coolant path. There is achieved an effect of capable of uniformly cooling the respective capacitor cells 514 by the coolant. The current balance between the capacitor terminals 503a through 503c and the capacitor terminals 503d through 503f is made uniform, the reduction in the inductance of the laminated layers conductor plate 501 can be achieved, and the thermal balance is made uniform, also the heat resistance can be improved.

The capacitor cell 514 is a unit structure of an electricity accumulating portion of the capacitor module 500, and there is used a film capacitor configuring a positive electrode and a negative electrode by respective 2 sheets of metal by laminating and winding 2 sheets of films vapor-deposited with the metal of aluminum or the like on one face thereof. Electrodes of the capacitor cell 514 are fabricated by configuring a positive electrode and a negative electrode respectively by wound axis faces and blowing a conductor of tin or the like.

A capacitor case 502 includes a containing portion 511 for containing the capacitor cells 514, and an upper face and a lower face of the containing portion 511 illustrated in the drawing configure substantially a rectangular shape. The capacitor case 502 is provided with holes 520a through 520h for penetrating fixing means, for example, screws for fixing the capacitor module 500 to the cooling block 12. An airtightness between the power semiconductor module and the coolant path 19 is promoted by providing the hole 520b, the hole 502c, the hole 502f, and the hole 502g between the power semiconductor module and the coolant path 19. A bottom face portion 513 of the containing portion 511 configures a smooth concave and convex shape or a wavy shape in conformity with a shape of a surface of the capacitor cell 514 in a circular cylinder shape. Thereby, it is easy to position the laminated layers conductor plate 501 and the module connected with the capacitor cells 514 to the capacitor case 502. After containing the laminated layers conductor plate 501 and the capacitor cell 514 to the capacitor case 502, a filling material (not illustrated) is filled into the capacitor case 502 to cover the laminated layers conductor plate 501 except the capacitor terminals 503a through 503f, the power source terminal 508 on the negative electrode side, and the power source terminal 509 on the positive electrode side. The capacitor cell 514 can be prevented from being shifted from a prescribed position by configuring the bottom face portion 513 by the wavy shape in conformity with the shape of the capacitor cell 514, when the filling material is filled into the capacitor case 502.

The capacitor cell 514 generates heat by electric resistances of a metal thin film vapor-deposited onto an inner film, and an inner conductor by a ripple current in switching. Hence, the capacitor cell 514 is molded by the filling material so as to make heat of the capacitor cell 514 easy to escape via the capacitor case 502. Humidity resistance of the capacitor cell 514 can also be improved by using a resin-made filling material. According to the present embodiment, the coolant path is provided along a longitudinal direction of the containing portion 511 of the capacitor module 500, and a cooling efficiency is increased. According to the present embodiment, the capacitor module 500 is arranged such that a side wall which forms a side in the longitudinal direction of the containing portion 511 is interposed by the coolant path 19, and therefore, the capacitor module 500 can efficiently be cooled. The capacitor cell 514 is arranged such that one of electrode faces of the capacitor cell 514 is opposed to an inner wall which forms a side in the longitudinal direction of the containing portion 511. Thereby, heat is easy to be transmitted in a direction of an axis of winding the film, and therefore, heat is made to be easy to escape to the capacitor case 502 via the electrode face of the capacitor cell 514.

Figure 2:
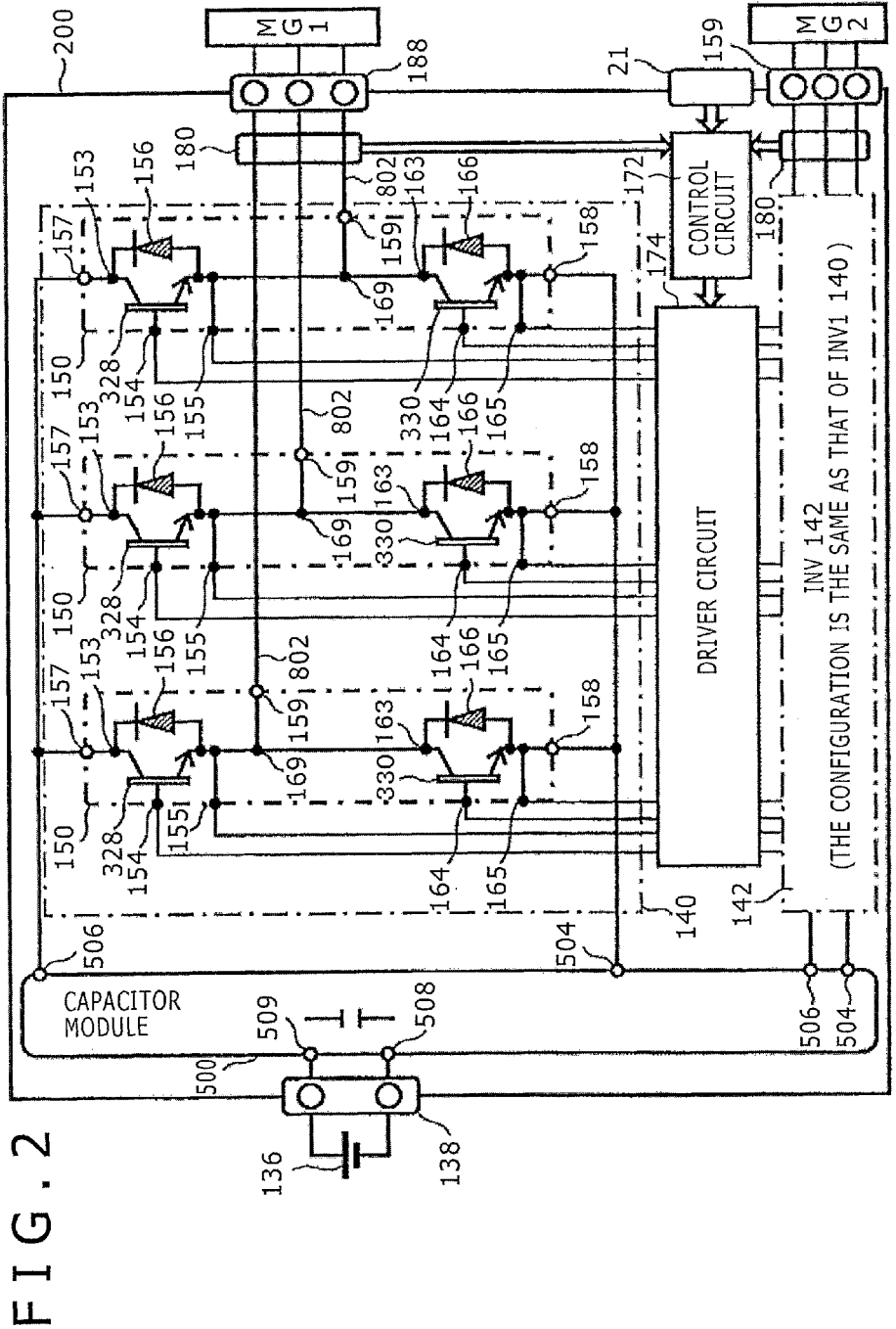
FIG. 2 is a circuit diagram showing a configuration of an electrical circuit shown in FIG. 1.
Figure 12:
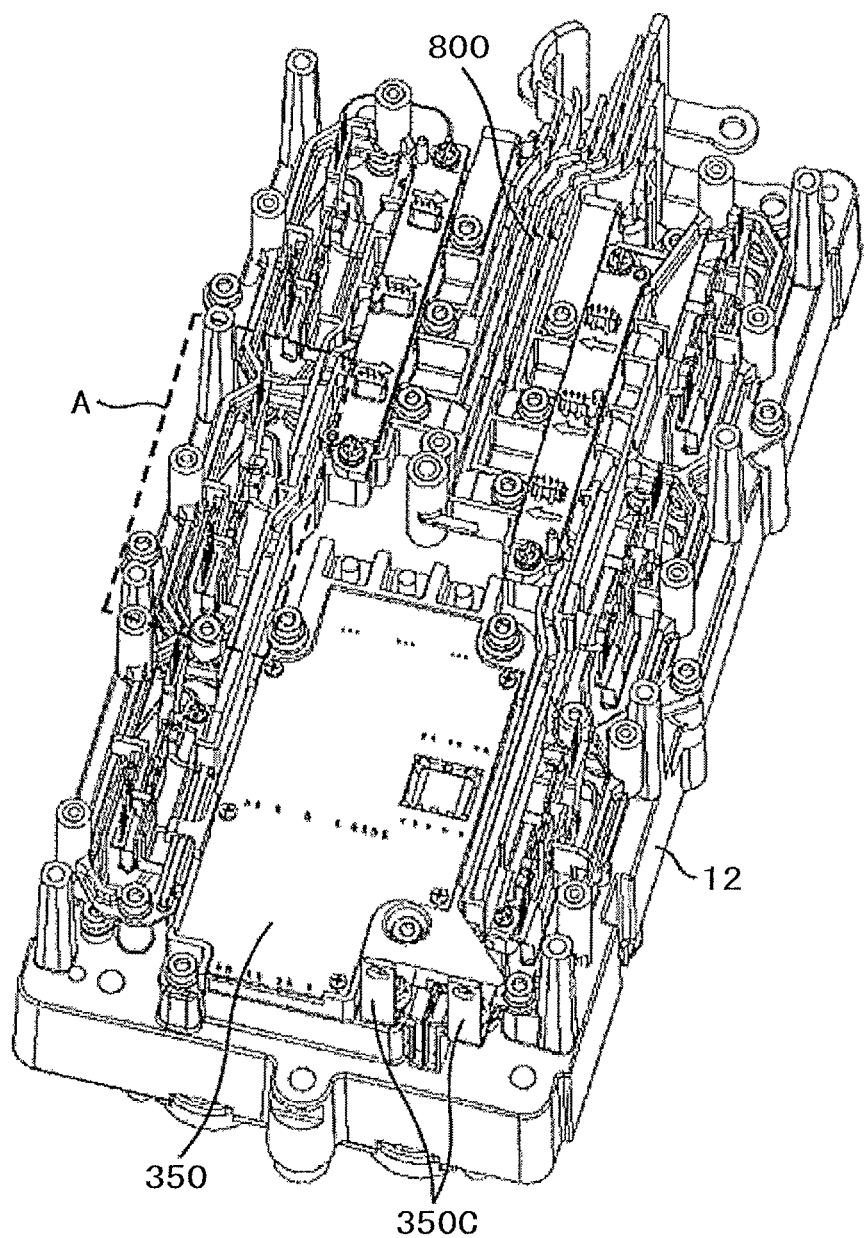
FIG. 12 is an outlook perspective view of a state in which the power semiconductor module, the capacitor module, and a busbar assembly are integrated to the cooling block.
Figure 13:
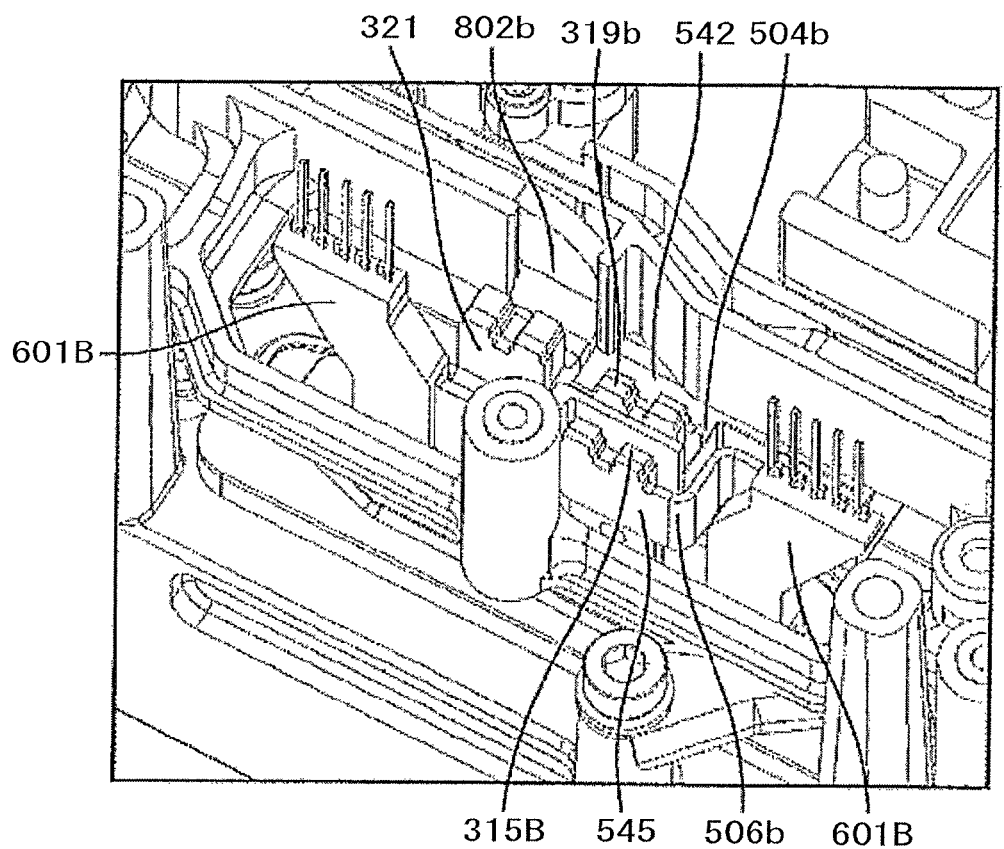
FIG. 13 is a view enlarging portion A indicated by a broken line of FIG. 12.

In the following explanation, the direct current positive electrode terminal 315B and the positive electrode terminal 157 illustrated in FIG. 2 are the same. The direct current negative electrode terminal 319B and the negative electrode terminal 158 illustrated in FIG. 2 are the same. FIG. 12 is a perspective view of an outlook where the cooling block 12 is integrated with the power semiconductor module, the capacitor module, and the busbar assembly. FIG. 13 is a view enlarging portion A of FIG. 12. In FIG. 11, FIG. 12, and FIG. 13, the direct current positive electrode terminal 315B (157), the direct current negative electrode terminal 319B (158), the alternate current terminal 321 (159), and the second sealing portion 601B are extended to a lid side in a vertical direction of the chassis 10. An area of current routes of the direct current positive electrode terminal 315B (157) and the direct current negative electrode terminal 319B (158) is very smaller than an area of a current route of the laminated layers conductor plate 501. Therefore, when a current flows from the laminated layers conductor plate 501 to the direct current positive electrode terminal 315B (157) and the direct current negative electrode terminal 319B (158), the area of the current route is changed by a large amount. That is, the current is concentrated on the direct current positive electrode terminal 315B (157) and the direct current negative electrode terminal 319B (158). In a case where the direct current positive electrode terminal 315B (157) and the direct current negative electrode terminal 319B (158) are protruded in a direction of traversing the laminated layers conductor plate 501, in other words, in a case where the direct current positive electrode terminal 315B (157) and the direct current negative electrode terminal 319B (158) are brought into a relationship of being twisted relative to the laminated layer conductor plate 501, a new conductor for connection is needed, and there is a possibility of a reduction in productivity and an increase in cost.

Hence, according to the present embodiment, the negative side capacitor terminal 504a has a raised portion raised from the laminated layers conductor plate 501, and includes a connecting portion 542 at a front end portion thereof. The positive electrode side capacitor terminal 506a includes a raised portion raised from the laminated layers conductor plate 501, and includes a connecting portion 545 at a front end portion thereof. The direct current negative electrode terminal 319B (158) or the direct current positive electrode terminal 315B (157) of the power semiconductor module 300 or 301 is connected to be interposed between the connecting portion 542 and the connecting portion 545. Thereby, the capacitor terminal 504a or 506a configures a laminated layers structure interposing an insulation sheet up to immediately before the connecting portion 542 or 545. Therefore, an inductance of a wiring portion of the capacitor terminal 504a or 506a on which the current is concentrated can be reduced. The front end of the direct current negative electrode terminal 319B (158) and a side of the connecting portion 542 are connected by welding. Similarly, the front end of the direct current positive electrode terminal 315B (157) and a side of the connecting portion 545 are connected by welding. Therefore, the productivity can be improved in addition to an improvement in the property by the low inductance formation.

A front end of the alternate current terminal 321 (159) of the power semiconductor module 300 or 301 and a front end of the alternate current bus bar 802a are connected by welding. In a production facility for welding, it is not preferable from viewpoints of productivity and cost to make a welding machine to be able to move in plural directions relative to a welding object, which amounts to complicate the production facility. Hence, according to the present embodiment, a welding portion of the alternate current terminal 321 (159) and a welding portion of the direct current negative electrode terminal 319B (158) are arranged linearly along a side in a longitudinal direction of the cooling block 12. Thereby, plural welding operations can be carried out during a time period of moving the welding machine in one direction, and the productivity is improved.

As shown in FIG. 4 and FIG. 12, the plural power semiconductor modules 300a through 300c are arranged linearly along a side in the longitudinal direction of the cooling block 12. Thereby, when the plural power semiconductor modules 300a through 300c are welded, the productivity can further be improved.

Figure 14:
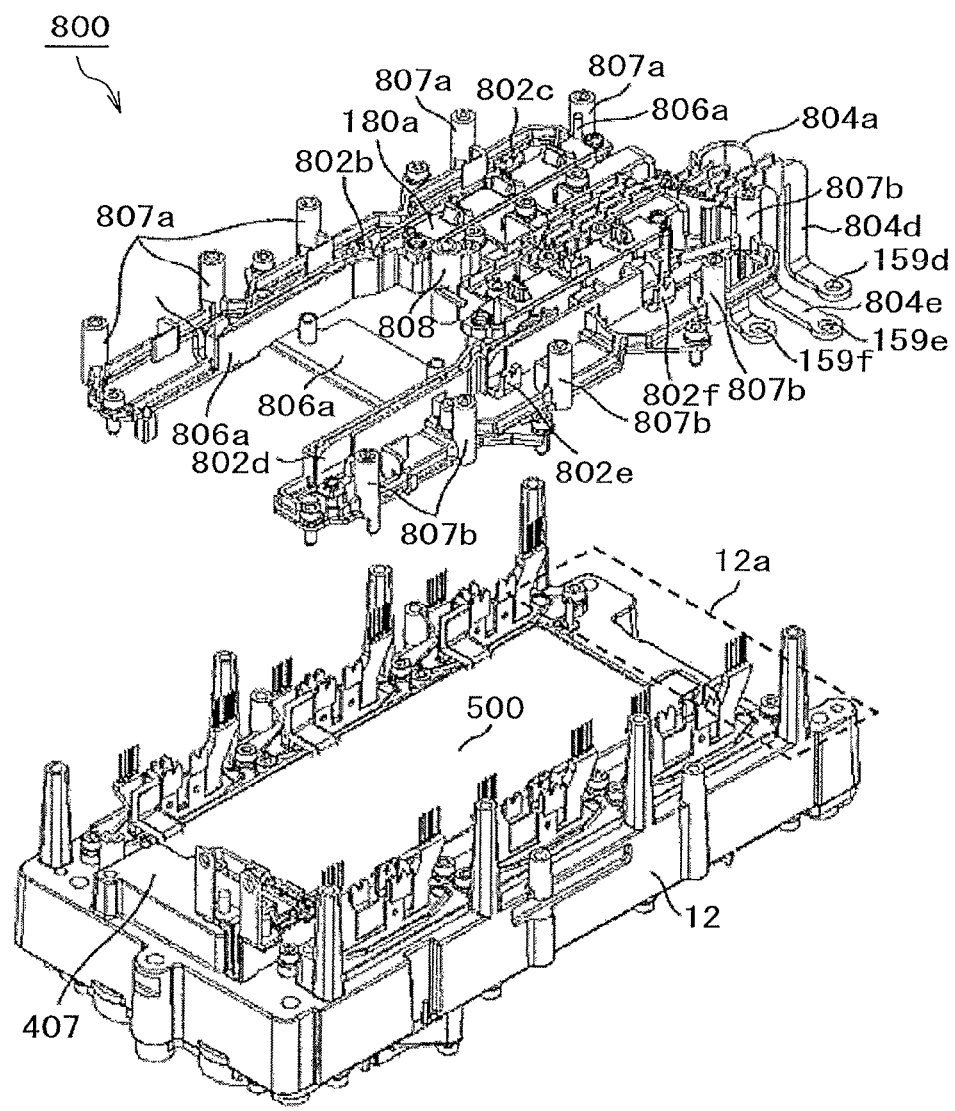
FIG. 14 is a disassembled perspective view showing a relationship between the cooling block integrated with the power semiconductor module and the capacitor module and the busbar assembly.
Figure 15:
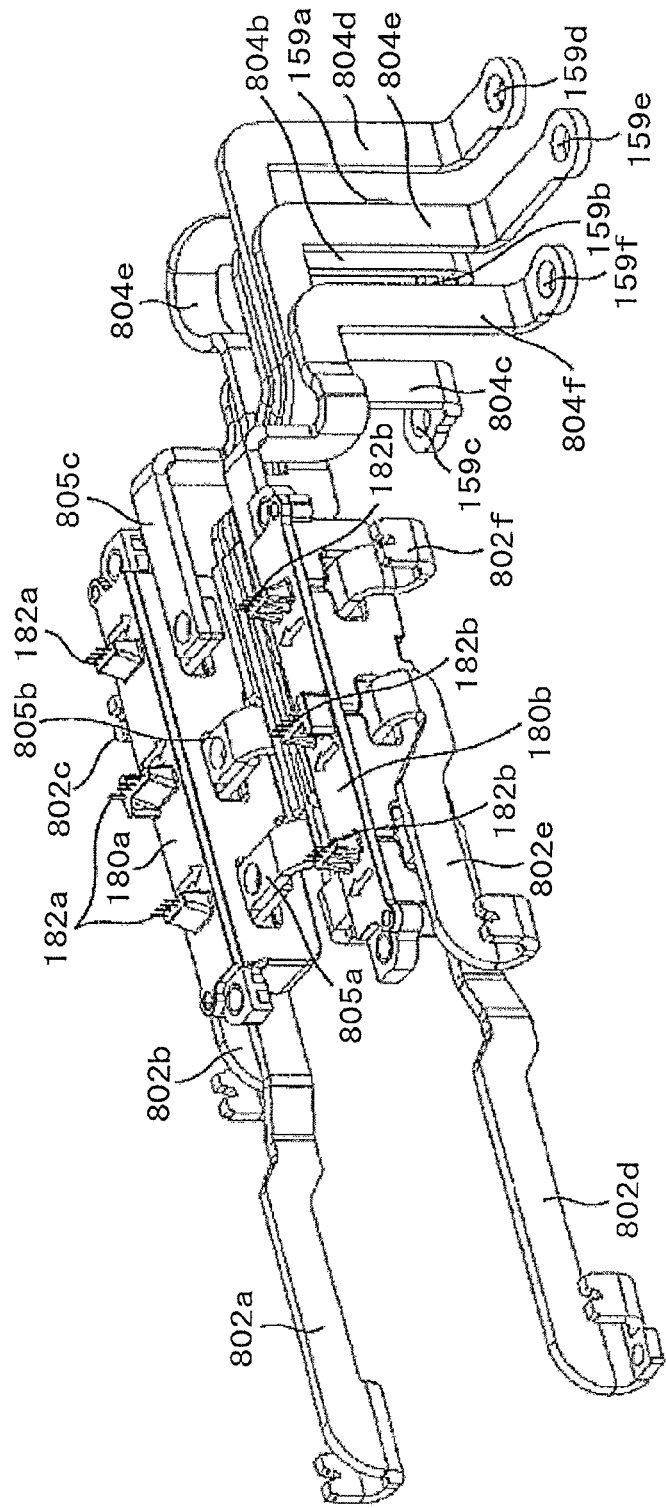
FIG. 15 is an outlook perspective view of the busbar assembly excluding a holder.

FIG. 14 is a disassembled perspective view of the cooling block 12 and the busbar assembly 800 integrated with the power semiconductor module and the capacitor module. FIG. 15 is a perspective view of an outlook of the busbar assembly 800 excluding a holder 803. In FIG. 14 and FIG. 15, the busbar assembly 800 includes the holder 803 for holding and fixing first and second alternate current bus bars respectively arranged on the both sides, and first alternate current bus bars 802a through 802f, and second alternate current bus bars 804a through 804f provided on the both sides. The busbar assembly 800 is further provided with a current sensor 180 for detecting alternate currents flowing in the first and the second alternate current bus bars 802 and 804 provided on the both sides. The first and the second alternate current bus bars 802 and 804 provided on the both sides are respectively made by wide width conductors, and the first alternate current bus bars 802a through 802f on the both sides are arranged such that the wide width faces are substantially orthogonal to the main face of the laminated layers conductor plate 501 of the capacitor module 500 up to a portion of installing the current sensor 180a or the current sensor 180b. The first alternate current bus bars 802a through 802f are respectively folded to bend substantially orthogonally in front of a through hole of the current sensor 180a or 180b, and the wide width faces of the alternate current bus bars are brought into a state of being substantially in parallel with the main face of the laminated layers conductor plate 501. The first alternate current bus bars 802a through 802f are connected to the second alternate current bus bars 804a through 804f after penetrating holes of the current sensor 180a and the current sensor 180b. Large portions of the second alternate current bus bars 804a through 804f are brought into a state where wide width faces thereof are substantially orthogonal to the main face of the laminated conductor plate 501 of the capacitor module 500, that is, a state where narrow width faces thereof of the alternate current bus bars are directed in a vertical direction of the power inverter. As illustrated in FIG. 15, the first alternate current bus bars 802a through 802f are connected to the second alternate current bus bars 804a through 804f by connecting portions 805a through 805f (connecting portions 805d through 805f are not illustrated) formed at the first alternate current bus bars 802a through 802f after passing the hole of the current sensor 180a or the current sensor 180b after penetrating the holes of the current sensor 180a and the hole of the current sensor 180b.

As described above, the second alternate current bus bars 804a through 804f are folded to bend substantially orthogonally toward the side of the capacitor module 500 at vicinities of the connecting portions 805a through 805f. Thereby, main faces of the second alternate current bus bars 804a through 804f are formed to be substantially orthogonal to the main face of the laminated layers conductor plate 501 of the capacitor module 500. As shown by FIG. 12, FIG. 14 and FIG. 15, the second alternate current bus bars 804a through 804f are extended from the vicinity of the current sensor 180a or the current sensor 180b to one side 12a in a transverse direction of the cooling block 12, and formed to traverse the side 12a. That is, the second alternate current bus bars 804a through 804f are formed to traverse the side 12a in a state where main faces of the plural second alternate current bus bars 804a through 804f face each other.

Large-sized formation of the total of the device can be reduced by arranging the alternate current bus bars 802a, 802b, 802d, and 802e on the both sides along the coolant paths arranged on both sides on inner sides of the chassis 10. The narrow width faces of the wide width conductors are arranged to be aligned to be directed in the vertical direction of the device. Therefore, a space occupied by the first alternate current bus bar 802 and the second alternate current bus bar 804 can be reduced, and the large-sized formation of the total of the device can be reduced. Leading wirings around at outside of the power inverter 200 is made to be easy by protruding the plural alternate current bus bars from one face side of the cooling block 12, and the productivity is improved.

As shown in FIG. 14, the first alternate current bus bars 802a through 802f, the current sensors 180a and 180b, and the second alternate current bus bars 804a through 804f are held and insulated by the holder 803 configured by a resin. An insulating performance among the second alternate current bus bars 804a through 804f, the cooling block 12 and the chassis 10 made of a metal is improved by the holder 803.

The busbar assembly 800 is configured by a structure which is fixed to the cooling block 12 by the holder 803. Even when heat is assumedly transmitted to the chassis 10 from outside, a temperature rise is restrained at the cooling block 12 which is formed with the flow path of the coolant. Not only a temperature rise of the busbar assembly 800 can be restrained but a temperature rise of the current sensor 180 held by the bur bar assembly 800 can be restrained by fixing the busbar assembly 800 to the cooling block 12. The current sensor 180 has a property weak at heat, and the reliability of the current sensors 180a and 180b can be improved by the structure described above. In a case where the power inverter is fixed to the transmission as in the present embodiment, not only heat is transmitted to the chassis 10 from the side of the transmission TM, but heat is transmitted from the side of the motor generator via the second alternate current bus bars 804a through 804f. The heat can be shielded by the cooling block 12, or the heat can be escaped to the coolant, the temperature rise of the current sensors 180a and 180b can be restrained, and the reliability can be improved.

As shown in FIG. 14, the holder 803 includes a support member 807a and a support member 807b for supporting the driver circuit board 22 shown in FIG. 4. The plural support members 807a are provided, and formed along a side on one side in the longitudinal direction of the cooling block 12. The plural support members 807b are provided, and formed to be aligned along a side on the other side in the longitudinal direction of the cooling block 12. Screw holes for fixing the driver circuit board 22 are formed at front end portions of the support member 807a and the support member 807b.

The holder 803 includes a protruded portion 806a and a protruded portion 806b which are extended in an upper direction from portions arranged with the current sensor 180a and the current sensor 180b. The protruded portion 806a and the protruded portion 806b are respectively configured to penetrate the current sensor 180a and the current sensor 180b. As shown in FIG. 15, the current sensor 180a and the current sensor 180b include a signal line 182a and a signal line 182b which are extended in a direction of arranging the driver circuit board 22. The signal line 182a and the signal line 182b are bonded to wiring patterns of the driver circuit board 22 by solder. According to the present embodiment, the holder 803, the support members 807a and 807b, and the protruded portions 806a and 806b are integrally formed by a resin.

Thereby, the holder 803 is provided with a function of positioning the current sensor 180 and the driver circuit board 22, and therefore, an integrating and solder connecting operation of the signal line 182a and the driver circuit board 22 is made to be easy. A number of pieces of parts of the total of the power inverter can be reduced by providing a mechanism of holding the current sensor 180 and the driver circuit board 22 at the holder 803.

According to the present embodiment, the power inverter 200 is fixed to the chassis 10 provided at the transmission TM, and therefore, the power inverter 200 is considerably effected with an influence of vibration from the transmission TM. Hence, the holder 803 reduces the influence of the vibration effected to the driver circuit board 22 by providing a support member 808 for supporting a vicinity of a center portion of the driver circuit board 22. For example, a natural frequency of the driver circuit board 22 can be made to be higher than a frequency of the vibration transmitted from the transmission TM by supporting the center portion of the driver circuit board 22 by, for example, the support member 808. The influence of the vibration of the transmission TM effected to the driver circuit board 22 can be reduced. The holder 803 of the busbar assembly 800 is fixed to the cooling block 12 by a screw.

The holder 803 is provided with a bracket 809 for fixing an end portion on one side of the module for accessories 350. As shown in FIG. 4, an end portion on the other side of the module for accessories 350 is fixed to the cooling unit 407 by arranging the module for accessories 350 to the cooling unit 407. Thereby, the influence of the vibration effected on the module for accessories 350 can be reduced, and a number of pieces of parts for fixing can be reduced.

Figure 16:
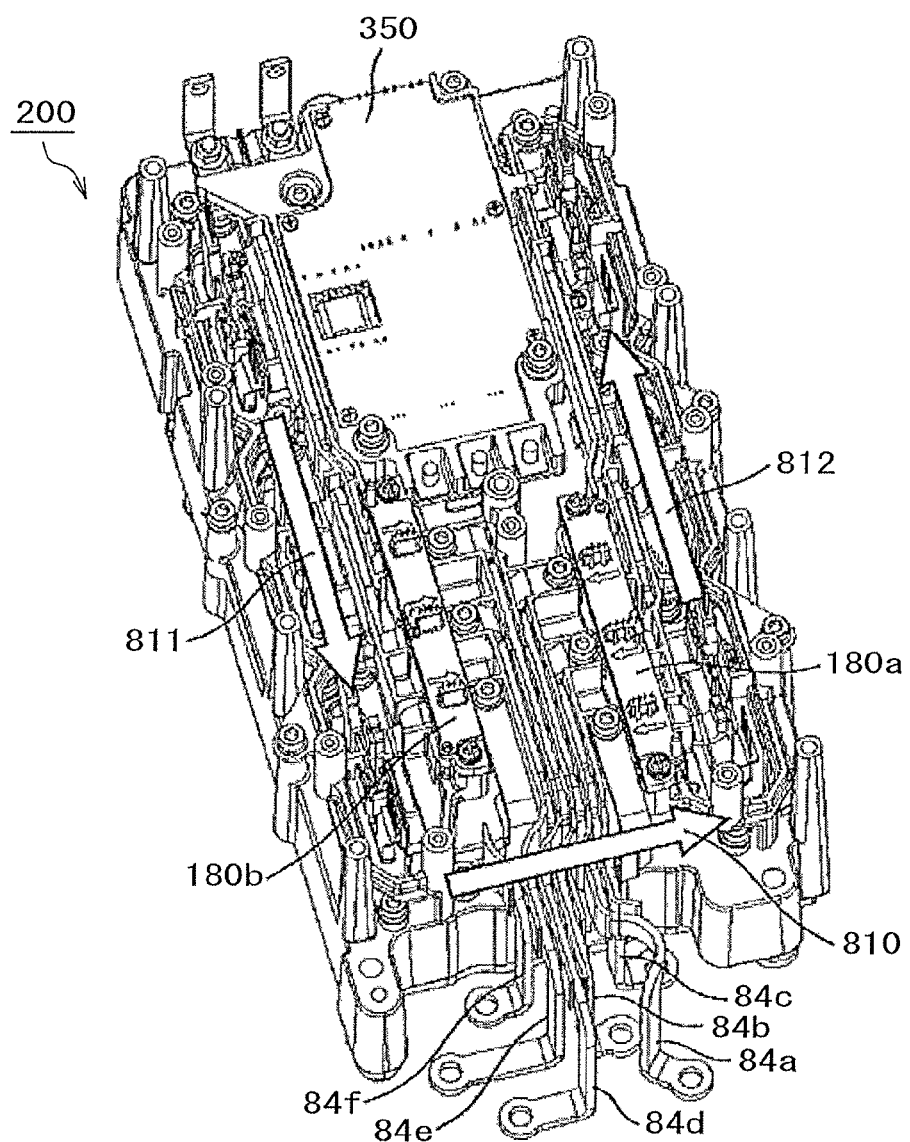
FIG. 16 is an outlook perspective view of the cooling block which is integrated with the power semiconductor module, the capacitor module, the busbar assembly, and a module for accessories.

FIG. 16 is a perspective view of an outlook of a state where the cooling block 12 is integrated with the power semiconductor module, the capacitor module, the busbar assembly 800, and the module for accessories 350. There is a case where when the current sensor 180 is at a temperature of about 100° C. or higher, the current sensor 180 cannot be used as a sensor. There is a case where the vehicle mounting power inverter is at a high temperature since an environment of using the power inverter is very severe, and it is one of important problems to protect the current sensor 180 from heat. Particularly, according to the present embodiment, the power inverter 200 is mounted on the transmission TM, and therefore, it is an important problem to protect the current sensor 180 from the influence of heat generated from the transmission TM.

Hence, according to the present embodiment, the current sensor 180a and the current sensor 180b are arranged on a side opposed to the transmission TM by interposing the cooling block 12 therebetween. Thereby, the heat generated by the transmission TM is made to be difficult to be transmitted to the current sensor, and the temperature rise of the current sensor can be restrained. The second alternate current bus bars 804a through 804f are formed to traverse the third flow path 19c shown in FIG. 5. The current sensor 180a and the current sensor 180b are arranged on a side nearer to the alternate current terminal 321 (159) of the power module than portions of the second alternate current bus bars 804a through 804f traversing the third flow path portion 19c. Thereby, the second alternate current bus bars 804a through 804f are cooled indirectly by the coolant, heat transmitted from the alternate current bus bar to the current sensor, and to a semiconductor chip in the power module can be alleviated, and therefore, the reliability is improved.

A flow direction 811 shown in FIG. 16 indicates the flowing direction of the coolant flowing in the fourth flow path 19d shown in FIG. 5. Similarly, a flowing direction 812 shows the flowing direction of the coolant flowing in the second flow path 19b shown in FIG. 5. According to the present embodiment, the current sensor 180a and the current sensor 180b are arranged such that when the current sensor 180a and the current sensor 180b are projected from an upper side of the power inverter 200, projected portions of the current sensor 180a and the current sensor 180b are surrounded by a projected portion of the coolant path 19. Thereby, the current sensors can further be protected from the heat from the transmission TM.

Figure 17:
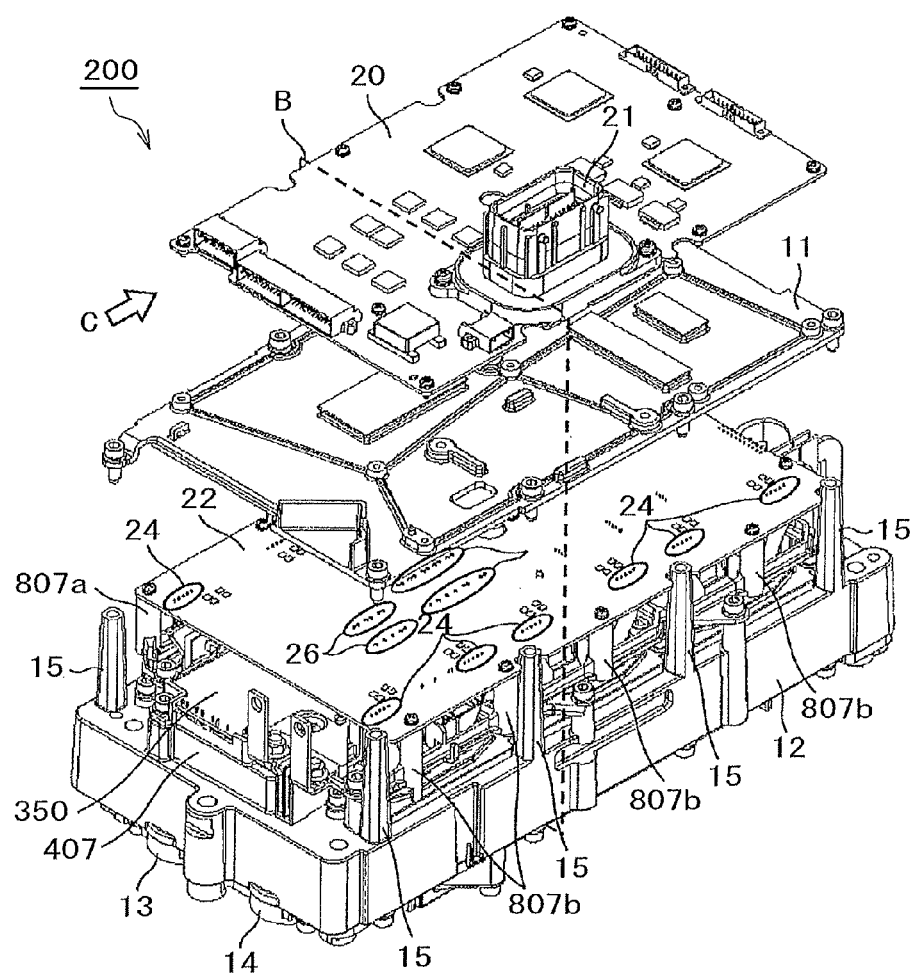
FIG. 17 is a perspective view of the power inverter separating a control circuit board and a metal base board for explanation.

FIG. 17 is a perspective view of a state of separating the control circuit board 20 and the metal base plate 11 for assisting understanding. As shown in FIG. 16, the current sensor 180 is arranged on an upper side of the capacitor module 500. The driver circuit board 22 is arranged on an upper side of the current sensor 180 of FIG. 16, and is supported by the support members 807a and 807b provided at the busbar assembly 800 shown in FIG. 14. The metal base plate 11 is arranged on an upper side of the driver circuit board 22, and is supported by plural support members 15 erected from the cooling block 12 according to the present embodiment. The control circuit board 20 is arranged on an upper side of the metal base plate 11 and is fixed to the metal base plate 11.

The current sensor 180, the driver circuit board 22, and the control circuit board 20 are arranged hierarchically in height direction, the control circuit board 20 is arranged at a location the most remote from the power semiconductor modules 300 and 301 of the heavy current system, and therefore, a switching noise or the like can be restrained from being mixed. The metal base plate 11 is electrically connected to the cooling block 12 which is electrically connected to the ground. Noise mixed from the driver circuit 22 to the control circuit board 20 is reduced by the metal base plate 11.

It is preferable to prevent a complexity of connecting steps and a failure in connecting when the wiring connector is used in electrically connecting the current sensor 180 and the driver circuit board 22. In FIG. 17, the driver circuit board 22 is formed with a first hole 24 and a second hole 26 which penetrate the driver circuit board 22. The first hole 24 is inserted with the signal terminal 325U and the signal terminal 325L of the power semiconductor module 300 and the signal terminal 325U and the signal terminal 325L are bonded to a wiring pattern of the driver circuit board 22 by solder. The second hole 26 is inserted with the signal line 182 of the current sensor 180, and the signal line 182 is bonded to the wiring pattern of the driver circuit board 22 by solder. Solder bonding is carried out from a side of a face of the driver circuit board 22 on a side opposed to a face opposed to the cooling block 12.

Thereby, the signal line can be connected without using the wiring connector, and therefore, the productivity can be improved. The productivity can further be improved by bonding the signal terminal 325 of the power semiconductor module 300 and the signal line 182 of the current sensor 180 by solder from the same direction. A danger of a failure in connection can be reduced by respectively providing the first hole 24 for penetrating the signal terminal 325 and the second hole 26 for penetrating the signal line 182 at the driver circuit board 22.

The driver circuit board 22 according to the present embodiment is mounted with a driver circuit (not illustrated) of a driver IC chip or the like on a side of a face opposed to the cooling block 12. Thereby, damage of the driver IC chip or the like by solder bonding is prevented by restraining heat of solder bonding from being transmitted to the driver IC chip or the like. A high shoulder part such as a transformer mounted on the driver circuit board 22 is arranged at a space between the capacitor module 500 and the driver circuit board 22, and therefore, the total of the power inverter 200 can be formed by a low shoulder.

According to the present embodiment, the power semiconductor modules 300 and 301 which are inserted into the coolant path 19 and fixed are cooled and the capacitor module 500 is cooled by the coolant flowing in the coolant path 19. It is preferable to also cool the module for accessories 350 in order to restrain a temperature rise by heat generation. A portion in the chassis 10 which can be cooled is limited, and therefore, it is necessary to devise a cooling method or a cooling structure.

Figure 19:
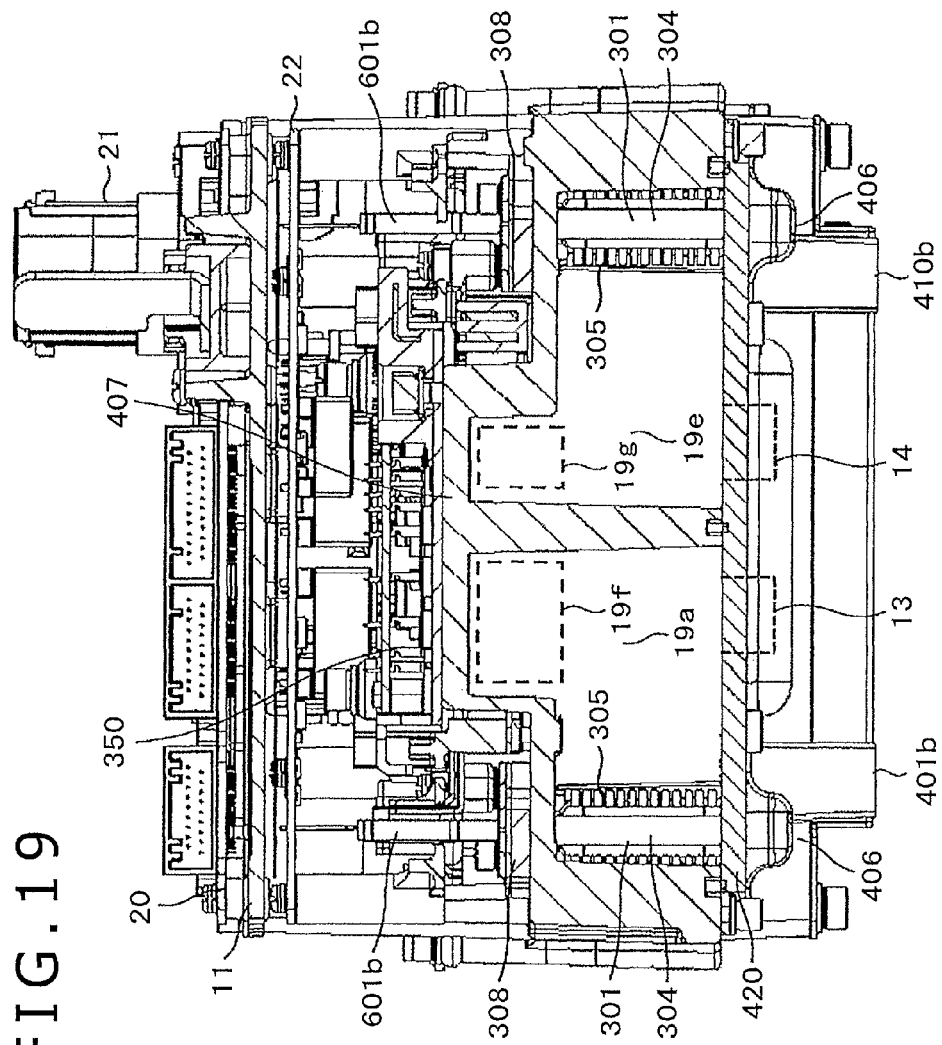
FIG. 19 is a sectional view of a portion of a cooling unit shown in FIG. 4.

Hence, according to the present embodiment, a heat radiating face of the module for accessories 350 which is formed by a metal base is arranged to be opposed to the cooling unit 407 shown in FIG. 4. The cooling unit 407 of FIG. 4 is provided to cool the module for accessories 350. FIG. 5 shows the back side of the cooling unit 407. FIG. 19 shows a sectional view of a portion of the cooling unit 407. In FIG. 4, FIG. 5, and FIG. 19, the module for accessories 350 is fixed such that the radiating face is brought into contact with an outer peripheral face of the cooling unit 407. The cooling unit 407 is formed on the upper side of the inlet pipe 13, and therefore, heat can be efficiently deprived from the module for accessories 350 by impacting the coolant flowing from the lower side to the inner wall of the cooling unit 407 to change to flow direction. The coolant flowing in from the inlet pipe 13 indicated by a broken line of FIG. 19 is impacted to an upper face of a coolant reservoir 19f that is formed at an inner portion of the cooling unit 407 to change the flow direction, and at this occasion, the heat of the cooling unit 407 is deprived. The coolant the direction of which is changed flows from the flow path 19a to the flow path 19b shown in FIG. 4 and FIG. 5, and cools the power semiconductor modules 300 and 301. The coolant which has cooled the power semiconductor module 301 flows into the flow path 19e and is discharged from the outlet pipe 14 shown by a broken line. A coolant reservoir 19g is formed at an upper portion of the flow path 19e, and the cooling unit 407 is cooled by the coolant at the coolant reservoir. The coolant reservoir 19f on the flow in side is made to be larger than the coolant reservoir 19g on the outlet side in order to make a fluid resistance of the coolant path in a pertinent state. The module for accessories 350 can efficiently be cooled by such a structure.

Figure 18:
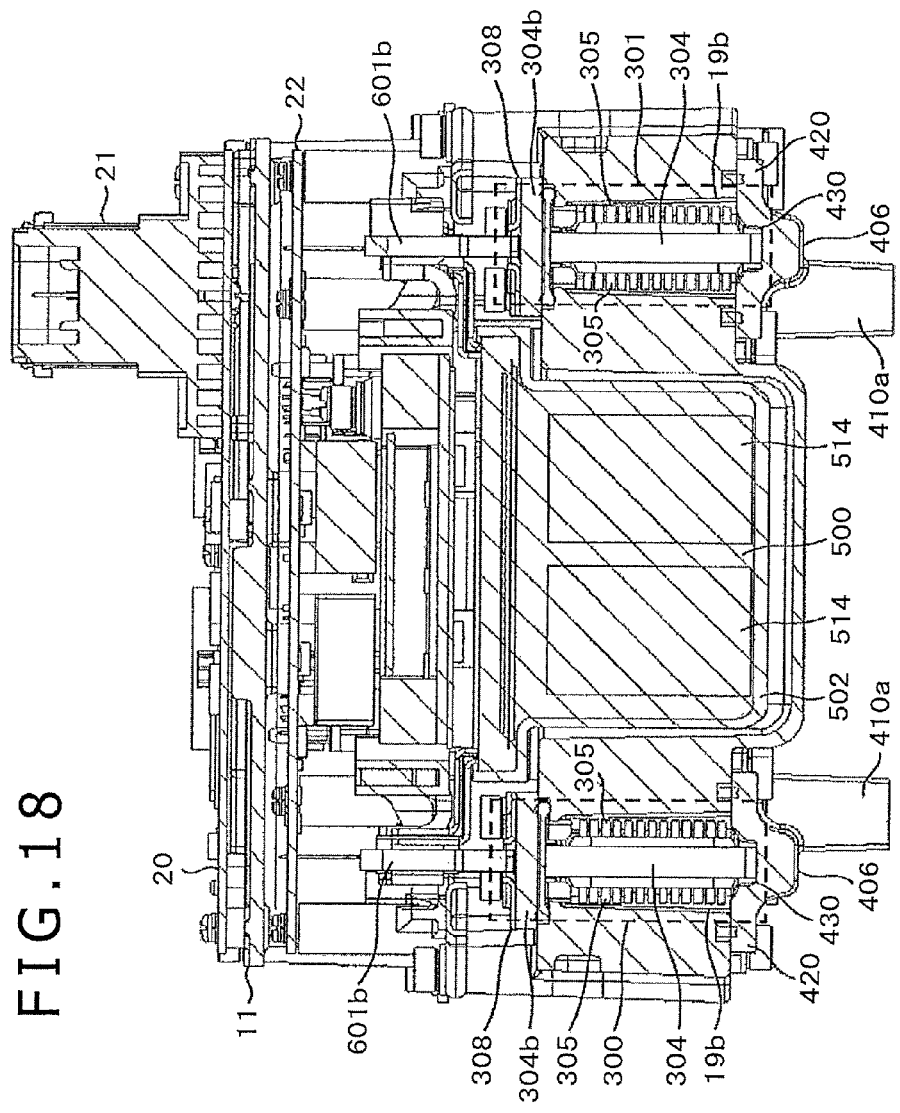
FIG. 18 is a sectional view viewing a section at a broken line B of FIG. 17 from a direction of an arrow mark C.

FIG. 18 is a sectional view viewing a face of the power inverter 200 indicated by a broken line B of FIG. 17 from a C direction. The flange 304B provided at the module case 403 can promote the airtightness of the coolant path 19 by pressing the flange to an opening of the flow path and pressing the module case 304 to the cooling block 12. It is necessary to make the coolant in the coolant path 19 flow to an area formed with the fins 305 in order to increase a cooling efficiency of the power semiconductor module 300. The module case 304 is not formed with the fins 305 at a lower portion thereof in order to ensure the space of the curved portion 304A. Hence, the lower cover 420 is formed to be fitted to the concave portions 430 that are formed at the lower cover 420. Thereby, the coolant can be prevented from flowing to a space where the cooling fins are not formed.

As illustrated in FIG. 6 through FIG. 10, according to the present embodiment, the power semiconductor module 300 or 301 incorporates the upper and lower arms series circuits 150 shown in FIG. 2, and the reduction in the inductance is achieved. There is conceivable a configuration in which the upper arm and the lower arm are configured by different power semiconductor modules and the upper and the lower arms are connected in series at outside of the power semiconductor module although the property is deteriorated from the view point of reducing the inductance. As the other embodiments, FIG. 20 through FIG. 22 show embodiments configuring the upper arm and the lower arm by separate power semiconductor modules. FIG. 20 is an upper view of a state where there is used the power semiconductor module containing an upper or lower arm in the power semiconductor module, and the power semiconductor module is contained in the cooling block 12.

In FIG. 20, the cooling block 12 is formed with the flow paths of the coolant on the both sides along long sides as explained in reference to FIG. 5, and the upper arm semiconductor modules 150A containing the upper arms and the lower arm semiconductor modules 150B containing the lower arms are alternately inserted into the coolant paths. The upper arm semiconductor module 150A includes the positive electrode terminal 157, the alternate current terminal 169A of outputting the alternate current, and the terminals 154 and 155 for control shown in FIG. 2. The lower arm semiconductor module 150B includes the negative electrode terminal 158, the alternate current terminal 169B of outputting the alternate current, and the terminals 154 and 155 for control. The capacitor module 500 is contained at the center of the cooling block 12 similar to that shown in FIG. 4, the capacitor terminal 506 on the positive electrode side is connected to the positive electrode terminal 157, and the capacitor terminal 504 on the negative electrode side is connected to the negative electrode terminal 158. In the capacitor, the direct current power is supplied from the battery 136 of FIG. 1 to the power source terminal 509 on the positive electrode side and the power source terminal 508 on the negative side via the direct current connectors 138, and the capacitor module 500 respectively supplies the direct current power to the positive electrode terminal 157 of the upper arm semiconductor module 150A and the negative electrode terminal 158 of the lower arm semiconductor module 150B. Here, the upper and lower arms series circuit 150 is produced when the alternate current terminal 169A of the upper arm semiconductor module 150A and the alternate current terminal 169B of the lower arm semiconductor module 150B are connected.

FIG. 21 is a diagram showing a connecting relationship of the alternate current terminal 169A of the upper arm semiconductor module 150A, the alternate current terminal 169B of the lower arm semiconductor module 150B, and the bus bars 802a through 802c, and FIG. 22 is a diagram showing a connecting relationship of the alternate current terminal 169A of the upper arm semiconductor module 150A, the direct current terminal 169B of the lower arm semiconductor module 150B, and the busbar assembly 800. The connection of the alternate current terminal 169A of the upper arm semiconductor module 150A and the alternate current terminal 169B of the lower arm semiconductor module 150B in FIG. 20 is carried out by the alternate current bus bars 802a through 802f in FIG. 21 and FIG. 22. For example, in FIG. 21, the alternate current terminal 169A and the alternate current terminal 169B are connected by the alternate current bus bar 802a. The alternate current bus bar 802a achieves two functions of a function of series connection of the upper arm semiconductor module 150A and the lower arm semiconductor module 150B and a function of outputting the alternate current from the series connection point. Similarly, the alternate current bus bar 802b through the alternate current bus bars 802f respectively achieve two functions of a function of series connection of the upper arm semiconductor module 150A and the lower arm semiconductor module 150B in correspondence with each other and a function of outputting the alternate current from the series connection point. FIG. 22 includes the holder 803 for holding the alternate current bus bars 802a through 802f.

The embodiments of FIG. 20 through FIG. 22 are basically the same as the embodiments of FIG. 3 through FIG. 5 and FIG. 11 through FIG. 19 with regard to the cooling and integrating method of the capacitor module 500, the power semiconductor module, the current sensor 180, and the busbar assembly 800. Therefore, the resolution of the problem and the effect explained in the embodiments of FIG. 3 through FIG. 5 and FIG. 11 through FIG. 19 can similarly be achieved.

Although in the above-described, the explanation has been given of the various embodiments and modified examples, the present invention is not limited to the content of these. Other modes conceivable within the range of the technical sort of the present invention are also included in the range of the present invention.

The disclosure content of the following priority base application is incorporated herein as a citation.

Japanese Patent Application No. 2010-84777 (filed on Apr. 1, 2010)

The invention claimed is:
1. A power inverter comprising:
a metallic chassis having a containing space at an inner portion thereof, having a lid on one side in a vertical direction, other side thereof being enclosed by a bottom;
a cooling block forming a coolant path on a side of the bottom in the vertical direction of the chassis along a side portion of the inner portion of the chassis;
a plurality of power semiconductor modules each incorporating a semiconductor chip for configuring an inverter circuit of converting a direct current (DC) power into an alternate current (AC) power, a direct current terminal for making a current flow to the semiconductor chip and a control terminal for controlling an operation of the semiconductor chip being provided to be protruded to an outer portion;
a capacitor module arranged on a center side relative to a coolant path formed along the side portion of the chassis and including a direct current terminal;
an alternate current busbar assembly arranged on a side of the lid in the vertical direction of the chassis relative to the capacitor module and the coolant path; and
a driver circuit arranged on the lid side in the vertical direction relative to the alternate current busbar assembly;
wherein the respective power semiconductor modules are fixed to the cooling block in a state of being inserted into the coolant path; and
wherein the alternate current busbar assembly includes a plurality of alternate current bus bars for making alternate currents generated by the respective power semiconductor modules flow and a plurality of fixing portions for fixing the alternate current busbar assembly, the plurality of alternate current bus bars configure a shape of extending along the coolant path, and the alternate current busbar assembly is fixed by the plurality of fixing portions.

2. The power inverter according to claim 1, wherein the capacitor module configures a shape of substantially a rectangular shape, the coolant path is formed along a long side of a rectangular shape, and the plurality of fixing portions of the alternate current busbar assembly are arranged along the coolant path.

3. The power inverter according to claim 1, wherein the coolant path is formed along an outer periphery of the capacitor module; and
wherein the driver circuit is formed at a driver board, the driver board includes a plurality of driver fixing portions for fixing, and the driver fixing portion is arranged along the coolant path.

4. A power inverter comprising:
a metallic chassis having a containing space at an inner portion thereof, having a lid on one side in a vertical direction, and having a bottom on other side thereof;
a cooling block of forming a coolant path on a side of the bottom in the vertical direction of the chassis;
a plurality of power semiconductor modules each incorporating a semiconductor chip for configuring an inverter circuit of converting a direct current power into an alternate current power, a direct current terminal for making a current flow to the semiconductor chip, an alternate current terminal for making an alternate current flow and a control terminal for controlling an operation of the semiconductor chip being provided to be protruded to an outer portion;
a capacitor module arranged along with the coolant path and including a direct current terminal;
an alternate current busbar assembly arranged on a side of the lid in the vertical direction of the chassis relative to the capacitor module and the coolant path; and
a driver circuit of supplying a control signal of the semiconductor chip to the control terminal of the power semiconductor module;

wherein the direct current terminal of the capacitor module and the direct current terminal of each of the power semiconductor modules are electrically connected;

wherein the alternate current busbar assembly includes a plurality of alternate current bus bars comprising wide width conductors extended along the coolant path and a plurality of fixing portions for fixing the alternate current busbar assembly;

wherein a narrow face of each of the wide width conductors of each of the alternate current bus bars comprising the wide width conductor is directed in the vertical direction;

wherein the wide width face is directed in a direction of traversing the vertical direction and the wide width faces of the respective alternate current bus bars are arranged to be opposed to each other via a space; and wherein the respective alternate current bus bars of the alternate current busbar assembly are connected to the corresponding alternate current terminals of the power semiconductor module.

5. The power inverter according to claim 4, wherein a board having the driver circuit is arranged on the lid side of the alternate current busbar assembly; and wherein the alternate current terminal of the power semiconductor module and the corresponding alternate current busbar assembly are connected by welding, and the board having the driver circuit and the control terminal of the power semiconductor module are connected by soldering.

6. A power inverter comprising:
a metallic chassis having a containing space at an inner portion thereof, and having a lid on one side in a vertical direction and a bottom on other side thereof;
a cooling block forming a first and a second coolant path on a side of the bottom in the chassis respectively along both side portions of the inner portion of the chassis;
a power semiconductor module incorporating a semiconductor chip for configuring an inverter circuit of converting a direct current power into an alternate current power, a direct current terminal for making a current flow in the semiconductor chip, an alternate current terminal for making an alternate current flow, and a control terminal for controlling an operation of the semiconductor chip being provided to be protruded to an outer portion;
a capacitor module arranged by being interposed by the first and the second coolant path and including a direct current terminal;
an alternate current busbar assembly arranged on the lid side in the chassis relative to the capacitor module and the coolant path; and
a driver circuit of supplying a control signal to the control terminal of the power semiconductor module;
wherein a plurality of the power semiconductor modules are arranged to be respectively inserted into the first and the second coolant paths;
wherein the direct current terminal of the capacitor module and the corresponding direct current terminal of the power semiconductor module are electrically connected;
wherein the alternate current busbar assembly includes sets of a first and a second alternate current bus bar respectively arranged along the first and the second coolant paths and having respective pluralities of alternate current bus bars of a wide width shape, and a plurality of fixing portions for fixing the alternate current busbar assembly;

wherein the sets of the respective alternate current bus bars are fixed by directing respective narrow faces of the alternate current bus bars of the wide width shape in the vertical direction and directing wide width faces thereof in a direction of traversing the vertical direction, the set of the first alternate current bus bars is arranged along the first coolant path, and the set of the second alternate current bus bars is arranged along the second coolant path; and wherein an electrical circuit is arranged between the sets of the first and the second alternate current bus bars.

7. The power inverter according to claim 6, wherein the electrical circuit arranged between the sets of the first and the second alternate current bus bars is an inverter circuit for accessories for generating an alternate current power of driving a motor for accessories.

8. A power inverter comprising:
a metallic chassis having a containing space at an inner portion thereof;
a capacitor module for smoothing arranged at the inner portion of the chassis and including a direct current terminal;
a cooling block of forming a coolant path along the capacitor module;
a power semiconductor module incorporating a series circuit of upper and lower arms for configuring an inverter circuit of converting a direct current power into an alternate current power, a direct current terminal for making a current flow to the series circuit of the upper and lower arms, an alternate current terminal for outputting an alternate current power, and a control terminal for controlling an operation of the upper and lower arms being provided to be protruded to an outer portion;
an alternate current busbar assembly arranged on one side in a vertical direction of the chassis relative to the capacitor module and the coolant path; and
a driver circuit further arranged on the one side in the vertical direction relative to the alternate current busbar assembly;
wherein a plurality of the power semiconductor modules are arranged to be inserted into the coolant path;
wherein the direct current terminal of the capacitor module is electrically connected to the direct current terminal of the power semiconductor module so as to supply a direct current power;
wherein the alternate current busbar assembly includes a plurality of alternate current bus bars having a wide width extended along the coolant path and a fixing portion for fixing the alternate current busbar assembly;
wherein the power semiconductor module includes cooling surfaces on both faces thereof, includes a semiconductor module case configured by a shape slender in the vertical direction and slender along the flow path, and the direct current terminal and the alternate current terminal protruded from the semiconductor module case to the one side in the vertical direction, and is provided with the control terminal further protruded to be long to the one side in the vertical direction relative to the direct current terminal and the alternate current terminal;
wherein the alternate current busbar assembly is electrically connected to the corresponding alternate current terminal of the power semiconductor module; and
wherein the driver circuit supplies a control signal for controlling the upper arm or the lower arm to the corresponding control terminal of the power semiconductor module.

9. The power inverter according to claim 8, wherein the alternate current bus bars having the wide width of the alternate current busbar assembly are configured by a shape of directing respective narrow faces thereof in the vertical direction and respectively extending the alternate current bus bars along the coolant path, and wide width faces of the alternate current bus bars configuring the alternating busbar assembly being arranged to be opposed to each other via a space.

10. The power inverter according to claim 8, wherein the alternate current output terminals are provided respectively in an extending direction along the coolant path.

11. The power inverter according to claim 9, wherein the alternate current output terminals are provided respectively in an extending direction along the coolant path.

12. A power inverter comprising:
a metallic chassis having a containing space at an inner portion thereof;
a capacitor module for smoothing including a direct current terminal and provided at an inner portion of the chassis;
a cooling block forming a coolant path to be along the capacitor module at the inner portion of the chassis;
a power semiconductor module incorporating a semiconductor chip for configuring an inverter circuit of converting a direct current power into an alternate current power, the semiconductor chip being provided with a direct current terminal for making a current flow to the semiconductor chip, an alternate current terminal for making an alternate current flow, and a control terminal for controlling an operation of the semiconductor chip to be protruded to an outer portion;
an alternate current busbar assembly arranged on one side in a vertical direction of the chassis relative to the capacitor module and the coolant path; and
a driver circuit arranged on the one side in the vertical direction relative to the alternate current busbar assembly;
wherein the direct current terminal of the capacitor module and the direct current terminals of the respective power semiconductor modules are connected by welding; and
wherein the alternate current busbar assembly includes a plurality of alternate current bus bars extended along the coolant path and a fixing portion for fixing the alternate current busbar assembly, the alternate current busbar assembly being fixed to the cooling block by the fixing portion.

13. The power inverter according to claim 12, wherein the alternate current terminals of the respective power semiconductor modules are connected to the corresponding alternate current terminal of the power semiconductor module by welding.

14. A power inverter comprising:
a metallic chassis having a containing space at an inner portion thereof, having a lid on one side in a vertical direction, other side thereof being enclosed by a bottom;
a cooling block forming a coolant path along a side portion of the inner portion of the chassis;
a power semiconductor module incorporating a semiconductor chip for configuring an inverter circuit of converting a direct current power into an alternate current power, a direct current terminal for making a current flow to the semiconductor chip, an alternate current terminal for making an alternate current flow, and a control terminal for controlling an operation of the semiconductor chip being provided to be protruded to an outer portion;
a capacitor module arranged to a center side relative to the coolant path, fixed to the cooling block, and including a direct current terminal;
an alternate current busbar assembly arranged on the one side in the vertical direction of the chassis relative to the capacitor module and the coolant path; and
a driver circuit;
wherein a plurality of the power semiconductor modules are fixed by being inserted into the coolant path;
wherein the alternate current busbar assembly includes a plurality of alternate current bus bars having a wide width, and a fixing portion for fixing the alternate current busbar assembly;
wherein the alternate current bus bars are arranged such that respective narrow width faces thereof are directed in the vertical direction, and the respective wide width faces are opposed to each other via a space;
wherein the alternate current busbar assembly is fixed to the cooling block by the fixing portion; and
wherein the driver circuit is fixed to the cooling block.

15. A power inverter comprising:
a metallic chassis having a containing space at an inner portion thereof, having a lid on one side in a vertical direction, other side thereof being enclosed by a bottom;
a cooling block arranged at the inner portion of the chassis, and forming a coolant path along a side portion of the chassis;
a plurality of power semiconductor modules each incorporating a semiconductor chip for configuring an inverter circuit of converting a direct current power into an alternate current power, a direct current terminal for making a current flow to the semiconductor chip, an alternate current terminal for making an alternate current flow, and a control terminal for controlling an operation of the semiconductor chip being provided to be protruded to an outer portion and fixed by being inserted into the coolant path;
a capacitor module for smoothing arranged at a center side relative to the coolant path, fixed to the cooling block, and including a direct current terminal;
an alternate current busbar assembly arranged on the one side in the vertical direction of the chassis relative to the capacitor module and the coolant path; and
a driver circuit of supplying a control signal to the control terminal of the power semiconductor module;
wherein the direct current terminal of the capacitor module is protruded from the capacitor module to be extended to a side of the corresponding direct current terminal of the power semiconductor module, an end portion thereof configures a shape of being extended to the one side in the vertical direction along a main current terminal of the power semiconductor module, and an end portion of the direct current terminal of the capacitor module is connected to the direct current terminal of the power semiconductor module by welding;
wherein an alternate current bus bar configuring a wide width shape included in the alternate current busbar assembly is extended to a side of the alternate current terminal of the power semiconductor module, an end portion thereof configures a shape of being extended to the one side in the vertical direction along the alternate current terminal, and the end portion is connected to the alternate current terminal by welding; and
wherein the driver circuit is connected to the control terminal of the power semiconductor module by soldering.

16. The power inverter according to claim 15, wherein a direct current bus bar protruded from the capacitor module and connected to the corresponding direct current terminal of the power semiconductor module has a first portion of extending from the capacitor module to a side of the main current terminal of the power semiconductor module, and a second portion of extending an end portion thereof to the one side in the vertical direction along the direct current terminal, and connected to the direct current terminal of the power semiconductor module by welding at the second portion; and wherein an alternate current bus bar of a wide width conductor included in the alternate current busbar assembly has a first portion of extending to a side of the alternate current terminal of the power semiconductor module, and a second portion of extending an end portion thereof to be folded to bend to the one side in the vertical direction along the alternate current terminal, and is connected to the alternate current terminal of the power semiconductor module by welding at the second portion.

17. A power inverter comprising:

a metallic chassis having a containing space at an inner portion thereof, having a lid on one side in a vertical direction, other side thereof being enclosed by a bottom, and having a fixing portion for fixing to a transmission for a vehicle at an outer portion on the other side; and a cooling block arranged at the inner portion of the metallic chassis, and forming a coolant path for making a coolant flow, a power semiconductor module incorporating a semiconductor chip of configuring an inverter circuit for converting a direct current power into an alternate current power, a capacitor module including a direct current terminal, an alternate current busbar assembly for making an alternate current generated by the power semiconductor module flow;

and a current sensor;

wherein the capacitor module and the coolant path are arranged to align so as to arrange the coolant path along the capacitor module;

wherein the alternate current busbar assembly is arranged on the one side in the vertical direction relative to the capacitor module;

wherein the alternate current busbar assembly includes a plurality of alternate current bus bars for making an alternate current flow, and a holder of holding the plurality of alternate current bus bars and a fixing portion for fixing, and the alternate current busbar assembly is fixed to the cooling block by the fixing portion of the holder; and wherein the current sensor for measuring a current flowing in the alternate current bus bar is fixed to the alternate current busbar assembly.

18. A power inverter arranged with:

a metallic chassis having a containing space at an inner portion thereof, having a lid on one side in a vertical direction, other side thereof being enclosed by a bottom, and having a fixing portion for fixing to a transmission at other portion of the other side; and a cooling block of forming coolant paths for respectively making a coolant flow to both side portions of the inner portion of the metallic chassis, a power semiconductor module of converting a direct current power into an alternate current power, and the capacitor module for smoothing, the power inverter being arranged with:

an alternate current busbar assembly for making an alternate current flow to the one side in the vertical direction relative to the capacitor module, the power inverter being arranged with:

a current sensor for measuring a current flowing in the alternate current bus bar on the one side in the vertical direction relative to the capacitor module, and within a range interposed by the coolant paths arranged on the both side relative to an axial direction of making the coolant flow.

19. The power inverter according to claim 18, wherein the alternate current busbar assembly is arranged on the one side in the vertical direction relative to the power semiconductor module and the capacitor module;

wherein the alternate current busbar assembly is further fixed to the cooling block; and wherein the cooling block is contained in the chassis.

* * * * *